United States Patent
Faris

(10) Patent No.: US 7,081,657 B2
(45) Date of Patent: *Jul. 25, 2006

(54) MEMS AND METHOD OF MANUFACTURING MEMS

(75) Inventor: Sadeg M. Faris, Pleasantville, NY (US)

(73) Assignee: Reveo, Inc., Elmsford, NY (US)

( * ) Notice: Subject to any disclaimer, the term of this patent is extended or adjusted under 35 U.S.C. 154(b) by 94 days.

This patent is subject to a terminal disclaimer.

(21) Appl. No.: 10/793,653

(22) Filed: Mar. 4, 2004

(65) Prior Publication Data

US 2004/0253794 A1 Dec. 16, 2004

Related U.S. Application Data

(63) Continuation of application No. 10/222,439, filed on Aug. 15, 2002, now Pat. No. 6,956,268, and a continuation-in-part of application No. 09/950,909, filed on Sep. 12, 2001.

(60) Provisional application No. 60/312,659, filed on Aug. 15, 2001, provisional application No. 60/299,284, filed on Jun. 19, 2001, provisional application No. 60/292,237, filed on May 18, 2001.

(51) Int. Cl.
*H01L 29/84* (2006.01)

(52) U.S. Cl. ............... 257/415; 257/419; 257/619; 257/E29.324; 438/52; 438/53

(58) Field of Classification Search ........ 257/415–420, 257/619, E29.324; 438/455, 52, 53; 428/307.3
See application file for complete search history.

(56) References Cited

U.S. PATENT DOCUMENTS

| 4,309,225 A | 1/1982 | Fan et al. | 148/1.5 |
|---|---|---|---|
| 4,370,176 A | 1/1983 | Bruel | 148/1.5 |
| 4,371,421 A | 2/1983 | Fan et al. | 156/624 |
| 4,471,003 A | 9/1984 | Cann | 427/34 |
| 4,479,846 A | 10/1984 | Smith et al. | 156/603 |
| 4,500,563 A | 2/1985 | Ellenberger et al. | 427/38 |
| 4,585,945 A | 4/1986 | Bruel et al. | 250/492.2 |
| 4,816,420 A | 3/1989 | Bozler et al. | 437/2 |
| 4,837,182 A | 6/1989 | Bozler et al. | 437/82 |
| 4,846,931 A | 7/1989 | Gmitter et al. | 156/633 |
| 4,883,561 A | 11/1989 | Gmitter et al. | 156/633 |
| 4,903,118 A * | 2/1990 | Iwade | 257/783 |
| 5,273,616 A | 12/1993 | Bozler et al. | 156/603 |
| 5,362,682 A | 11/1994 | Bozler et al. | 437/226 |
| 5,374,564 A | 12/1994 | Bruel | 437/24 |
| 5,453,153 A | 9/1995 | Fan et al. | 117/2 |

(Continued)

FOREIGN PATENT DOCUMENTS

EP 0355913 A1 2/1990

(Continued)

OTHER PUBLICATIONS

Miller, D.L., et. al., "GaAs Peeled Film Solar Cells," Rockwell International, pp. 1-45, Mar. 15, 1980-Dec. 31, 1981.

(Continued)

*Primary Examiner*—Minh-Loan Tran
(74) *Attorney, Agent, or Firm*—Ralph J. Crispino

(57) ABSTRACT

The present invention relates to micro electro-mechanical systems (MEMS) and production methods thereof, and more particularly to vertically integrated MEMS systems. Manufacturing of MEMS and vertically integrated MEMS is facilitated by forming, preferably on a wafer level, plural MEMS on a MEMS layer selectively bonded to a substrate, and removing the MEMS layer intact.

23 Claims, 15 Drawing Sheets

U.S. PATENT DOCUMENTS

| | | | |
|---|---|---|---|
| 5,559,043 A | 9/1996 | Bruel | 437/424 |
| 5,588,994 A | 12/1996 | Bozler et al. | 117/89 |
| 5,676,752 A | 10/1997 | Bozler et al. | 117/89 |
| 5,710,057 A | 1/1998 | Kenney | 437/62 |
| 5,714,395 A | 2/1998 | Bruel | 437/24 |
| 5,793,115 A | 8/1998 | Zavracky et al. | 257/777 |
| 5,845,123 A | 12/1998 | Johnson et al. | 395/377 |
| 5,877,070 A | 3/1999 | Goesele et al. | 438/458 |
| 5,882,987 A | 3/1999 | Srikrishnan | 438/458 |
| 5,897,939 A | 4/1999 | Deleonibus | 428/195 |
| 5,909,627 A | 6/1999 | Egloff | 438/408 |
| 5,920,764 A | 7/1999 | Hanson et al. | 438/4 |
| 5,933,750 A | 8/1999 | Wilson et al. | 438/455 |
| 5,976,953 A | 11/1999 | Zavracky et al. | 438/455 |
| 5,985,688 A | 11/1999 | Bruel | 438/53 |
| 5,993,677 A | 11/1999 | Biasse et al. | 216/36 |
| 5,994,207 A | 11/1999 | Henley et al. | 438/515 |
| 6,020,252 A | 2/2000 | Aspar et al. | 438/458 |
| 6,027,988 A | 2/2000 | Cheung et al. | 483/513 |
| 6,033,974 A | 3/2000 | Henley et al. | 438/520 |
| 6,054,363 A | 4/2000 | Sakaguchi et al. | 438/406 |
| 6,054,370 A | 4/2000 | Doyle | 438/456 |
| 6,059,877 A | 5/2000 | Bruel | 117/35 |
| 6,071,795 A | 6/2000 | Cheung et al. | 438/458 |
| 6,103,597 A | 8/2000 | Aspar et al. | 438/458 |
| 6,137,110 A | 10/2000 | Pellin et al. | 250/423 |
| 6,146,979 A | 11/2000 | Henley et al. | 438/458 |
| 6,155,909 A | 12/2000 | Henley et al. | 451/39 |
| 6,159,323 A | 12/2000 | Joly et al. | 156/241 |
| 6,159,824 A | 12/2000 | Henley et al. | 438/455 |
| 6,159,825 A | 12/2000 | Henley et al. | 438/460 |
| 6,162,705 A | 12/2000 | Henley et al. | 438/478 |
| 6,184,060 B1 | 2/2001 | Siniaguine | 438/458 |
| 6,184,111 B1 | 2/2001 | Henley et al. | 438/514 |
| 6,187,110 B1 | 2/2001 | Henley et al. | 148/33.2 |
| 6,190,937 B1 | 2/2001 | Nakagawa et al. | 438/67 |
| 6,190,998 B1 | 2/2001 | Bruel et al. | 438/407 |
| 6,191,007 B1 | 2/2001 | Matsui et al. | 438/459 |
| 6,204,151 B1 | 3/2001 | Malik et al. | 438/460 |
| 6,214,733 B1 | 4/2001 | Sickmiller | 438/691 |
| 6,221,738 B1 | 4/2001 | Sakaguchi et al. | 438/455 |
| 6,221,740 B1 | 4/2001 | Bryan et al. | 438/458 |
| 6,221,774 B1 | 4/2001 | Malik | 438/690 |
| 6,225,190 B1 | 5/2001 | Bruel et al. | 438/458 |
| 6,225,192 B1 | 5/2001 | Aspar et al. | 438/460 |
| 6,232,136 B1 | 5/2001 | Zavracky et al. | 438/30 |
| 6,309,945 B1 | 10/2001 | Sato et al. | 437/409 |
| 6,387,736 B1 | 5/2002 | Cao et al. | 438/149 |
| 6,875,671 B1* | 4/2005 | Faris | 438/455 |
| 2002/0171080 A1* | 11/2002 | Faris | 257/40 |
| 2003/0020062 A1* | 1/2003 | Faris | 257/40 |
| 2004/0201013 A1* | 10/2004 | Faris | 257/40 |
| 2005/0112848 A1* | 5/2005 | Faris | 438/458 |

FOREIGN PATENT DOCUMENTS

| | | |
|---|---|---|
| EP | 0793263 | 9/1997 |
| EP | 0938129 | 8/1999 |
| EP | 01045448 A1 | 10/2000 |
| FR | 2758907 | 7/1998 |
| FR | 2771852 | 6/1999 |
| JP | 63-155731 | 6/1988 |
| WO | WO 95/20824 A1 | 8/1995 |
| WO | WO 98/20543 A2 | 5/1998 |
| WO | WO 98/33209 | 7/1998 |
| WO | WO 99/05711 A1 | 2/1999 |
| WO | WO 99/08316 A1 | 2/1999 |
| WO | WO 99/35674 A1 | 7/1999 |
| WO | WO 99/39377 A1 | 8/1999 |
| WO | WO 99/66559 A1 | 12/1999 |
| WO | WO 00/03429 A1 | 1/2000 |
| WO | WO 00/24054 A1 | 4/2000 |
| WO | WO 00/24059 A1 | 4/2000 |
| WO | WO 00/46847 A1 | 8/2000 |
| WO | WO 00/48238 A1 | 8/2000 |
| WO | WO 00/75988 A1 | 12/2000 |
| WO | WO 00/75995 A1 | 12/2000 |
| WO | WO 01/03171 A1 | 1/2001 |
| WO | WO 01/03172 A1 | 1/2001 |

OTHER PUBLICATIONS

Fan, J.C.C., "Thin Films of III-V Compounds and Their Applications," Journal de Physique, 43, pp. C1-327, (1982).

Konagai, Makoto, et al., "High Efficiency GaAs Thin Film Solar Cells by Peeled Film Technology", Journal of Crystal Growth, vol. 45, pp. 277-280, 1978.

Bower, R.W., et al., "Aligned Wafer Bonding: A Key to Three Dimensional Microstructures," Journal of Electronic Materials, vol. 20, No. 5, pp. 383-387, 1991.

Lee, K.Y., et al., "Fabrication of Ultrasmall Devices on Thin Activ GaAs Membranes," J. Vac. Sci. Technol.B5 (1), pp. 322-325, 1987.

Camperi-Ginestet, C., "Alignable Epitaxial Liftoff of GaAs Materials With Selective Deposition Using Polyimide Daiphragms," IEEE Transactions Photonics Technology Letters, pp. 1123-1126, Dec. 12, 1991.

Hargis, M.C., et al., "Epitaxial Lift-Off GaAS/AlGaAs Metal—Semiconductor-Metal Photodetectors with Back Passivaton," IEEE Photonics Technology Letters, vol. 5, No. 10, pp. 1210-1212, 1993.

Schnitzer, L., et al., "Ultra-High Efficiency Light-Emitting-Diode Arrays," IEEE Transactions on Electron Devices, vol. 40, No. 11, pp. 2108-2109, Nov. 1993.

Zhang, L., et. al., "Low-energy Separation By Implantation of Oxygen Structures Via Plasma Source Ion Implantation," Applied Physics Lett., vol. 65, No. 8, pp. 962-964, Aug. 22, 1994.

Bengtsson, S., et al., "Silicon on Aluminum Nitride Structures Formed by Wafer Bonding," Proceedings IEEE International SOI Conference, pp. 35-36, Oct. 1994.

Zahraman, K., et al., "Epitaxial Lift-Off in Photovoltaics: Ultra Thin Al0.2Ga0.8AsCell in a Mechanically Stacked (AL, Ga)As/Si Tandem," First WCPEC, pp. 1898-1901, Dec. 5-9, 1994.

Young, Paul G., et al., "RF Control of Epitaxial Lift-Off PHEMT's Under Backside Illumination," IEEE Journal of Quantum Electronics, vol. 30, No. 8, pp. 1782-1786, Aug. 1994.

Hageman, P.R., et al., "Re-use of GAAS Substrates for Epitaxial Lift-Off III-V Solar Cells," IEEE, pp. 1910-1913, 1994.

Wilkinson, Scott T., et al., "Integration of Thin Film Optoelectronic Devices onto Micromachined Movable Platforms," IEEE Photonics Technology Letters, vol. 6, No. 9, 1115-1118, Sep. 1994.

Callahan, J., et al., "Alignable Lift-Off Transfer of Device Arrays Via A Single Polymeric Carrier Membrane," IEEE, pp. 1274-1277, 1995.

Spiering, Vincent L., et al., "Sacrificial Wafer Bonding for Planarization After Very Deep Etching," Journal of Microelectromechanical Systems, vol. 4, No. 3, pp. 151-157, Sep. 1995.

Bhattacharya, D., et al., "Optical Mixing in Epitaxial Lift-Off Pseudomorphic HEMT's," IEEE Photonics Technology Letters, vol. 7, No. 10, pp. 1171-1173, Oct. 1995.

Hohkawa, K., et al., "Fabricatoin of Surface Acoustic Wave Semiconductor Coupled Devices Using Epitaxial Lift-off Technology," IEEE Ultrasonics Symposium, pp. 401-404, 1995.

Fan, J.C., et al., "AlGAAs/GaAs Heterojunction Bipolar Transistors on Si Substrate Using Epitaxial Lift-Off," IEEE Electron Device Letters, vol. 16, No. 9, pp. 393-395, Sep. 1995.

Shah, Divyang M., et al., "Epitaxial Lift-Off GaAs HEMT's," IEEE Transactions on Electron Devices, vol. 42, No. 11, pp. 1877-1881, Nov. 1995.

Morf, T., et al., Integrating Optical Receiver Transplanted by Epitaxial Lift Off, IEEE, pp. 189-192, 1995.

Herrscher, M., "Epitaxial Liftoff In GaAs/InP MSM Photodetectors on Si," Electronics Letters, vol. 31, No. 16, pp. 1383-1384, Aug. 3, 1995.

Omnes, et al., "Substrate Free GaAs Photovoltaic Cells on Pd-Coated Silicon with a 20% AM1.5 Efficiency," IEEE Transactions on Electron Devices, vol. 43, No. 11, pp. 1806-1811 (Nov. 1996).

Jokerst. N.M., et al., "Thin-Film Multimaterial Optoelectronic Integrated Circuits," IEEE Transactions on Components, Packaging, and Manufacturing Technology—Part B, vol. 19, No. 1, pp. 97-105, Feb. 1996.

Tong, Q.Y., et al., "Feasiblity Study of VLSI Device Layer Transfer by CMP PETEOS Direct Bonding," Proceedings 1996 IEEE International SOI Conference, pp. 36-37, Oct. 1996.

Dohle, G. Rainer, et al., "A New Bonding Technique for Microwave Devices," IEEE Transactions on Components, Packaging, and Manufacturing Technology—Part B, vol. 19, No. 1, pp. 57-63, Feb. 1996.

Yazawa, Y., et al., "Three-Junction Solar Cells Comprised of a Thin-Film GainP/GaAs Tandem Cell Mechanically Stacked on a Si Cell," IEEE, pp. 899-902, Sep. 30-Oct. 3, 1997.

Yablonovitch, E., et al., "Extreme Selectivity in the Lift-Off of Epitaxial GaAs Films", Appl. Phys. Lett., 51 (26), pp. 2222-2224, Dec. 28, 1997.

Chun, Carl, et al., "Integrated 1.55 um Receivers Using GaAs MMICS and Thin Film, InP Detectors," IEEE, pp. 47-50, 1998.

Yun, C.H., et al., "Transfer of Patterned Ion-Cut Silicon Layers," Applied Physics Lett, vol. 73, No. 19, pp. 2772-2774, Nov. 9, 1998.

Geppert, Linda, "Solid State," IEEE Spectrum, pp. 52-56, Jan. 1999.

Pasquareillo, D. et al., "Mosa-Spacers: Enabling Non-Destructive Measurements of Surface Energy in Room Temperature Wafer Bonding," as published in *Semiconductor Wafer Bonding: Science, Technology and Applications*, Electrochemical Society Proceedings, vol. 99-35, pp. 110-118, Fall 1999.

Bagdahn, J. et al., "Lifetime Properties of Wafer-Bonded Components Under Static and Cyclic Loading ," as published in *Semiconductor Wafer Bonding: Science, Technology, and Applications*. Electrochemical Society Proceeding, vol. 99-35, pp. 129-135, Fall 1999.

Beggans, M., et al., "Oxidation Effect on Microcontamination and Bondability of Ultrathin Silicon Wafers," as published in *Semiconductor Wafer Bonding: Science, Technology, and Applications*, Electrochemical Society Proceedings, vol. 99-35, pp. 137-145, Fall 1999.

Pasquariello, D., et al., "Oxidation and Induced Damages in Oxygen Plasma In-Situ Wafer Bonding," as published in *Semiconductor Wafer Bonding: Science, Technology, and Applications*, Electrochemical Society Proceedings, vol. 99-35, pp. 169-177, Fall 1999.

Bagdahn, J. et al., Measurement of the Local Strength Distribution of Directly Bonded Silicon Wafers Using the Micro-Chevron-Test, as published in *Semiconductor Wafer Bonding: Science, Technology, and Applications*, Electrochemical Society Proceedings, vol. 99-35, pp. 218-231, Fall 1999.

Andreas, P. et al., "Room Temperature Covalent Bonding: Effect on Interfacial Properties," as published in Semiconductor Wafer Bonding: Science, Technology, and Applications, Electrochemical Society Proceedings, vol. 99-35, pp. 232-243, Fall 1999.

Kopper-Schmidt, P., et al., "Recent Developments in Adhesion-Enhanced High-Vacuum Bonding By In Situ Plasma Surface Preelcaning," as published in *Semiconductor Wafer Bonding: Science, Technology, and Applications*, Electrochmeical Society Proceedings, vol. 99-35, pp. 259-273, Fall 1999.

Krauter, G. et al., "Interface Chemistry of Tailor-Made Monolayers for Low-Temperature Wafer Bonding," as published in *Semiconductor Wafer Bonding: Science, Technology, and Applications*, Electrochemical Society Proceedings, vol. 99-35, pp. 275-281, Fall 1999.

Wiegand, M. et al., "Effect of O2 Plasma Pretreatment on the Bonding Behavior of Silicon (100) Wafers," as published in *Semiconductors Wafer Bonding: Science, Technology, and Applications*, Electrochemical Society Proceedings, vol. 99-35, pp. 282-291, Fall 1999.

Reiche, M. et al., "Plasma Activation for Low-Temperature Wafer Direct Bonding," as published in *Semiconductor Wafer Bonding: Science, Technology, and Applications*, Electrochemical Society Proceeding, vol. 99-35, pp. 292-325, Fall 1999.

Tong, Q.T., "Wafer Bonding and Layer Transfer for Microsystems: An Overview," as published in *Semiconductor Wafer Bonding: Science, Technology, and Applications*, Electrochemical Society Proceedings, vol. 99-35, pp. 1-39, Fall 1999.

Reiche, M. et al., "Bonding Behaviour of Different Interfacial Layers," as published in *Semiconductor Wafer Bonding: Science, Technology, and Applications*, Electrochemical Society Proceedings, vol. 99-35, pp. 100-105.

Labossicre, et al., "Characterization of Wafer Bond Toughness," as published in *Semiconductor Wafer Bonding: Science, Technology, and Applications, Electrochemical Society Proceedings*, vol. 99-35, pp. 338-349, Fall 1999.

Syms, R.R.A. et al., "3-D Self Assembly of Opto-Mechanical Structures Using Bonded Silicon-on-Insulator," as published in *Semiconductor Wafer Bonding: Science, Technology, and Applications*, Electrochemical Society Proceedings, vol. 99-35, pp. 110-118, Fall 1999.

Chu, Paul K. et al., "Microcavities Formed by Hydrogen or Helium Plasma Immersion Ion Implntation," IEEE, pp. 1238-1241.

King, Tsu-Jac, "Poly-Si TFTs for Plastic Substrates," Information Display, pp. 24-26, Apr. 2001.

Williams, David, et al., "Microsystems Mature," Spie's Magazine, pp. 27-29, May 2001.

Marcinkcvicius, Andrius et al., "Femtosecond Laser-Assisted Three-Dimensional Microfabrication in Silica," Optics Letters, vol. 26, No. 5, pp. 277-279, Mar. 1, 2001.

Jokerst, N.M., "Epitaxial Liftoff of GaAs Detectors Onto Silicon Integrated Circuits," pp. 664-665.

Tong, Q-Y., et al., "Wafer Bonding of Si With Dissimilar Materials," pp. 524-526.

Basco, Ricardo, et al., "Monolithic Integration of a 94GHz AlGAAs/GaAs 2 DEG Mixer on Quartz Substrate by Epitaxial Lift-Off," Department of Electrical and Computer Engineering University of Massachusetts, Amherst MA, pp. 38-39 (that is the only info.).

Akatsu T., et al., "Wafer Bonding of Compoun Semiconductors Using Atomic Hydrogen," Electrochemical Society Proceedings, vol. 99-35, pp. 60-419.

Schaffer, Chris B., et al., "Micromachining Using Ultrashort Pulses From a Laser Oscillator."

Huang, L-J., et al., "Critical Bonding Energy Required for Hydrogen-Implantation Induced Layer Splitting,"Electrochemical Society Proceedings, vol. 99-35, pp. 68-77.

Klem, J.F., et al., "Characteristics of Lift-Off Fabricated AlGaAs/InGaAs Single-Strained-Quantum-Well Structures on Glass and Silicon Substrates."

International Search Report Dated Jun. 10, 2003 for PCT/US0215864.

"Selective Wafer Bonding by Surface Roughness Control" by C. Gui, et al. published in Journal of the Electrochemical Society, 148 (4) G225-G228 2001 pp. G225-G228.

* cited by examiner

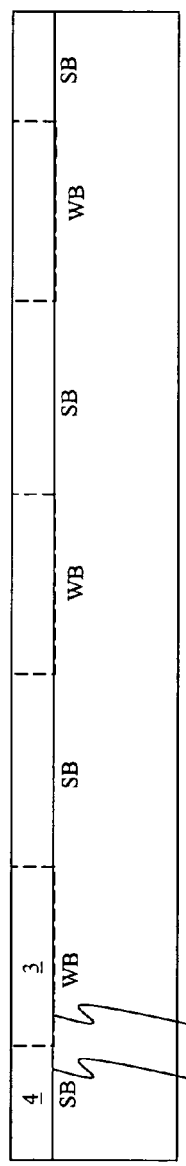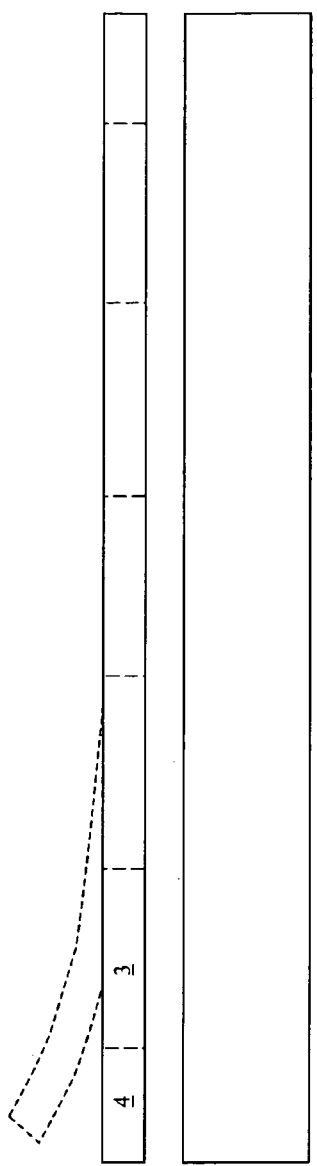
Figure 17
Figure 18
Figure 19

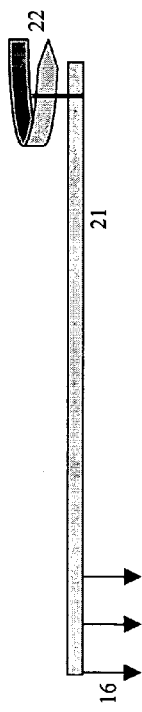
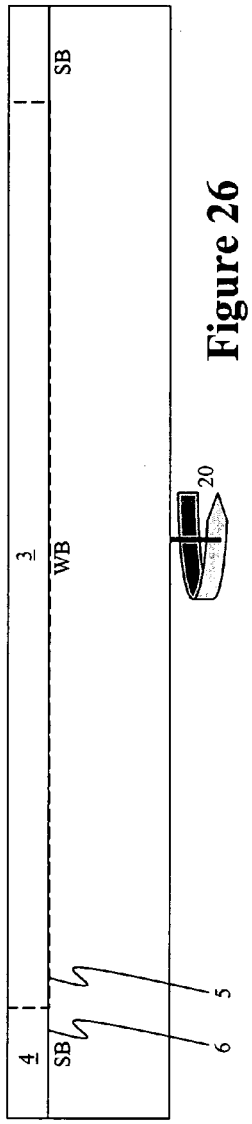
Figure 26
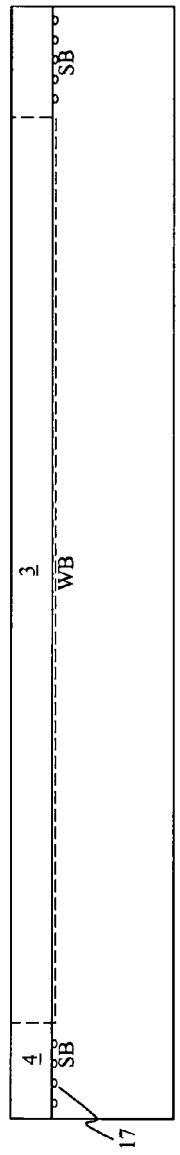
Figure 27
Figure 28

MEMS AND METHOD OF MANUFACTURING MEMS

RELATED CASED

The present application claims priority under 35 U.S.C. §120 and is a continuation of U.S. patent application Ser. No. 10/222,439 filed on Aug. 15, 2002 entitled "MEMS and Method of Manufacturing MEMS," which claims priority to U.S. Provisional Patent Application Ser. No. 60/312,659 filed on Aug. 15, 2001 entitled "MEMS And Method Of Manufacturing MEMS", and is a Continuation-in-part of U.S. patent application Ser. No. 09/950,909 filed on Sep. 12, 2001 entitled "Thin Films And Production Methods Theref", which claims priority to U.S. Provisional Patent Application Ser. No. 60/292,237 filed on May 18, 2001 entitled "Semiconductor Devices And Method For Manufacturing Thereof" and U.S. Provisional Patent Application Ser. No. 60/299,284 filed on Jun. 19, 2001 entitled "Thin Films And Production Methods Thereof."

BACKGROUND OF THE INVENTION

1. Field of the Invention

The present invention relates to micro electromechanical systems (MEMS) and production methods thereof, and more particularly to vertically integrated MEMS systems.

2. Description of the Prior Art

The field of MEMS has entered a rapid growth phase with an explosion of applications for MEMS-based sensors. While the attention of the popular press has highlighted genomics labs on a chip and microscopic robots, the biggest advantage of MEMS technology may not come from making tools and sensors smaller. It will be from making them cheaper. Yet, most MEMS devices are still stand-alone components and the cost advantages of ubiquitous integration are lost with this approach. MEMS devices are conventionally manufactured using the methods adapted from making electronic microchips. Integration enabled the microelectronics revolution. Large Scale Integration (LSI) put millions of transistors onto a single chip, while continually bringing more power to the marketplace at steadily decreasing costs. Microelectronics has moved to the next level of integration, making systems on a chip, or systems in a package. Yet, integration of MEMS devices onto a single chip remains largely unrealized. The challenges of MEMS integration are very different from the challenges of CMOS (Complementary Metal Oxide Semiconductor). While CMOS technology has reached the 100 million transistor integrated circuit (IC) milestone, the world of MEMS is still mostly made up of discrete devices. The MEMS industry is highly fragmented, with little integration. Most MEMS are discrete devices, due to the demanding processes of conventional MEMS manufacturing.

Integration of MEMS devices, besides lowering manufacturing costs, will do much to expand the capabilities of the devices. Sensitivity of most microsensors falls off geometrically with decreasing size. For example, the output from a torsional capacitive accelerometer drops off as the fifth power of the lateral dimension.[1] The problems of line capacitance and signal-to-noise ratio make it impractical to shrink such a sensor without onboard circuitry to detect and process such diminishing signals. In the industry today, the primary focus of MEMS sensor integration is to provide on-chip control circuitry. The automotive industry has been a leader in the combination of different sensors onto a single chip. For example, many pressure sensors and accelerometers address the temperature sensitivity of the response curves by adding on-chip thermometers for temperature compensation. Further steps have been achieved. For example, Toyota Nippondenso has reported an automotive sensor suite combining sensors for engine pressure and temperature, on to the same chip as an impact air bag trigger.[2] Sensor suites, however, continue to be a niche market of highly specific functions and high volume products due to the complex design and extensive resources required to construct a suite.

[1] Gabrielson, T. B., "Fundamental noise limits for miniature acoustic and vibration sensors", Transactions of the ASME. Journal of Vibration and Acoustics, Vol. 17(4), p. 405 (1995).

[2] T. Fuji, Y. Gotoh, and S. Kuroyanagi, "Fabrication of Microdiaphragm Pressure Sensor Utilizing Micromachining," Sensors and Actuators, A34:217 (1992).

Integration continues to be a difficult problem. Polysilicon is a core material for micromachining, and an excellent example of the conflicts in MEMS integration. The high temperatures of deposition (approximately 630° C.) and of annealing (>900° C.) are incompatible with aluminum and copper metalization. Either the process flow must be compromised, or a more expensive, and more resistive, refractory metal such as tungsten must be used.[3] MEMS processing poses a unique set of challenges to integration resulting from the temperature-sensitive thin film materials, very deep etching, anodic bonding and strain-relief anneals that are required. Designing an integrated sensor suite on a single chip poses many challenges in combining the steps used to form common accelerometers with, for example, an IC temperature sensor or a thin film thermistor. Moreover, the resulting design will be inflexible; upgrading to an improved sensor requires a complete redesign and purchase of a new mask set.

[3] K. A. Honer, "Surface micromachining techniques for integrated microsystems", Ph.D. thesis, Stanford University, March, 2001.

Vertical integration, or stacking of microdevices into the same package, is an attractive way to decrease packaging volume, to increase circuit density and conserve board space, and to increase performance and functionality. Reductions of interchip delays and power consumption are both benefits of stacked integration. If the devices are thinned and stacked on top of each other, the advantages in cost and circuit density are potentially huge. For both IC and MEMS processes, the third dimension of the silicon wafer remains largely unexploited.

Current commercial approaches to vertical stacking of 2-dimensional devices are generally chip-scale and rely on wafer thinning by grinding. Most methods rely on interconnection by way of throughholes or wire-bonded, stacked mother-daughter chips. Current methods all have limitations with respect to package size, cost, reliability and yield impact. Despite the difficulties, stacking devices to achieve 3-D integration is finding applications, particularly in combining MEMS with ASIC (Application Specific Integrated Circuit) controllers. High density memory packages made by stacking individual chips have found specialty applications.

One implementation of 3-dimensional packaging has been undertaken by Irvine Sensors, Irvine, Calif., and IBM. Discrete die have been stacked and interconnected utilizing an edge lift-off process.[4] Known-good-die (KGD) are thinned. Solder bumps at the die edge are used to align and interconnect the stacked die. The die are potted in an epoxy matrix. The epoxy helps to align different sized die, and is used as the interconnect surface. The individual stacking and interconnection of die, along with the requirement for KGD causes this to be a very expensive manufacturing method.

[4] J. Minahan, A. Pepe, R. Some, and M. Suer, "The 3D stack in short form (memory chip packaging)," Proceedings 42nd Electronic Components and Technology Conference, San Diego, Calif., (1992)

Another implementation of 3-dimensional packaging has been undertaken by Cubic Memory, who manufactures high-density, stacked memory modules by applying gold interconnect traces that are deposited over insulating layers of polyimide on whole wafers. However, stacking and vertical interconnect is still on an individual chip-scale.

A further implementation of 3-dimensional packaging has been undertaken by Tessera, San Jose, Calif., in conjunction with Intel, to develop chip-scale, stacked package by attaching the chips onto flexible substrates via micro-ball grid array bonding, then z-folding the chip-loaded tape onto itself.

Ziptronix is apparently developing wafer-scale stacking of ICs. Considerable challenges with alignment, stress management, thermal management, high density interconnect and yield are still being addressed.

There are various deficiencies with available vertical integration. One primary deficiency is due to yield loss. All approaches to device stacking that are currently in the marketplace are die-scale. Individual die are prepared, aligned, stacked and connected. The processing is expensive and the yield loss for the stack is the compounded yield loss for each device in the layer. The increased yield loss is sometimes tolerated for inexpensive devices such as SRAM stacks. But when more expensive devices are being stacked, the solution is to use known good die (KGD). For KGD, each unpackaged die undergoes burn-in and test. Furthermore, the stack requires electrical test after the completion of each layer. The process is very expensive and the applications have been limited to high end users, such as military and satellite technology.

Another deficiency of conventional vertical integration is due to the fact that the technology is limited to a die-scale. With the exception of the yet-to-reach-the market approach of Ziptronix, all of the approaches to stacking devices are on die scale. The significant economic advantage of wafer-scale manufacturing is completely unavailable to these technologies. The high cost of handling and testing individual die restricts these methods to high-end applications.

Still another deficiency of conventional vertical integration relates to material incompatibility. Organic adhesive and potting compounds are used to build the stack. The use of adhesives and potting compounds is incompatible with many useful processes. The thermal coefficient of expansion (TCE) of the adhesive is generally not matched to the TCE of the wafers. Strict limits must be placed on the temperature and thermal cycling in subsequent processes, and in device operation to prevent die cracking and delamination. Moreover, most of the adhesives are organic compounds and thus are incompatible with semiconductor processes involving oxidizing ambient, high temperatures and aggressive chemical exposure.

Sensor integration remains a very expensive, design-intensive effort. Current sensor integration is primarily found in the automotive industry, the high design costs are amortized over the huge volume of parts manufactured. A new system and method of integration is needed to make the vast potential of integrated MEMS devices available to a broader applications.

Semiconductor and MEMS devices are made in only a small portion of the wafer thickness; the majority of the wafer thickness is for structural support during the manufacturing of the devices. Indeed, it is common to backgrind a finished wafer before packaging to improve the thermal transfer. An additional feature of very thin devices is that they are flexible, which is advantageous in managing the mechanical stresses of wire bonding and packaging. Despite advantages of very thin layers, thinning to less than 100 microns is very costly and therefore is seldom done. To avoid punching through in any region of the wafer, lapping must be performed at low rate and must be performed iteratively with careful wafer thickness mapping. Wafer thinning may be accomplished by wet etch or by plasma etch of the backside, with similar complexities with thickness uniformity and breakthrough. A layer may be incorporated in the wafer as an etch or polish stop. For example, a silicon nitride layer may be incorporated into silicon as a hard polish stop, or an implanted layer of born can stop a dopant-selective etch. While these methods are effective, they are costly and difficult to implement.

Applications for MEMS sensors have grown rapidly. The market size for all types of microsystems was estimated at over $14B year 2000, with a predicted 21% compounded annual growth rate (CAGR). Environmental monitors make up less than 5% of the market, but the forecasted CAGR of 35% over the next 4 years is much higher than average for the market.[5] Improved cost and reliability are major drivers causing many conventional sensors to be replaced by microsensors. Microsensors are available to measure acceleration, vibration, pressure, temperature, humidity, strain, proximity, rotation, acoustic emission, and many others. Examples of applications include automotive air bag safety systems, other automotive applications, security systems, shock sensors, biomedical applications.

[5] R. H. Grace, "The New MEMS and Their Killer Apps", Sensors Magazine, July 2000.

Automotive air bag safety systems are triggered by MEMS accelerometers. Over 1,000 lives are saved every year thanks to air bag systems made affordable by MEMS sensors. The National Highway Traffic Safety Administration (NHTSA) estimates that hundreds more lives could be saved by smart air bag systems with a sensor array which adjusts for the severity and location of the impact, and for presence, position, motion and weight of the occupant.[6] The sensor market for air bag deployment has enjoyed rapid growth of a 20%–25% CAGR over the preceding 5 years.

[6] "Advanced air bags, final economic assessment", FMVSS NO. 208, NHTSA Office of Regulatory Analysis & Evaluation, Plans and Policy, May, 2000.

Automotive applications for MEMS are enormous. MEMS sensors measure the level of engine oil, fuel, coolant, transmission and brake fluid. Pressure sensors monitor ABS line pressure, vacuum level, fuel injection pressure, tire pressure and more. Chemical and flow sensors are employed to monitor exhaust makeup, intake flows. Temperature sensors optimize engine performance, and along with humidity sensors, determine cabin comfort. Driver safety and convenience are enhanced by vehicle dynamic control for measuring yaw rate and by collision avoidance proximity sensors. There are many more. Cheaper and more powerful sensor suites have enormous potential to increase driver safety, improve cabin comfort, and to make engines longer lasting and more environmentally friendly.

Security systems combine sensor types to expand the net of detection and to limit false alarms through intelligent redundancy of alarms. Proximity, motion, vibration and heat detection are combined. Integrated sensor arrays have vast potential for battlefield sensor networks which monitoring troop strengths and movements. Miniaturized wireless communications integrated with microsensor suites will enable smart sensor webs with enormous potential.[7]

[7] J. M. Kahn, R. H. Katz and K. S. J. Pister, "Mobile Networking for Smart Dust", ACM/IEEE Intl. Conf. on Mobile Computing and Networking (MobiCom 99), Seattle, Wash., Aug. 17–19, 1999.

Shock sensors protect disk drives by inhibiting read/write operations during mechanical disturbances. Product lifetimes can be extended by data from vibration sensors, and imminent failure of critical components can be predicted, decreasing downtime of mission-critical systems. Environmental monitors hold great promise for product inventory and quality control monitoring, as well as water and air testing.

Biomedical applications are truly revolutionary, and go far beyond DNA sequencing to include new drug discovery techniques, as well as new and rapid testing for illnesses. Enormous improvements in quality of life will come from improved drug delivery methods biomechanical devices such as hearing aids and artificial vision.

Optical switches and optical switching components (e.g., variable optical attenuators) also are proposed and formed using MEMS, for example, including rotating micro-mirrors that direct light in desired directions, impart delays, and other functionality.

The microsystems market is big and getting bigger at a rapid rate. A method to build integrated sensor suites which is cost effective and universal to any type of sensor holds vast potential to create many new, exciting applications. Cheaper and more powerful sensors will have enormous positive impact on every aspect of society.

Various sensor technologies for MEMS temperature, humidity and shock sensors exist. Temperature can be measured by many means, the most common being Resistance Temperature Detector (RTD), thermistor and IC devices. It also possible to use capacitive measurement of pressure changes to generate an electrical signal based on a temperature change. This is generally implemented as a pressure sensitive oscillator, making power requirements relatively high. The RTD also requires a relatively high operating current, and self-heating can make short duty cycling difficult to implement. On the other hand, a very low power thin-film thermistor is straightforward to construct. An amorphous germanium thermistor has been reported which draws only 1 microA at 2V.[8] The temperature coefficient of resistance (TCR) was reported as approximately −2%/K at room temperature. With such a low current drain, self-heating effect of the thermistor may be safely ignored. A further advantage is that the sensor can be operated with a power supply (battery) without requiring an external current source. Response curves, though parabolic, have a sufficiently linear characteristic that linearization may not be necessary.

[8] G. Urban, A. Jachimowicz, H. Ernst, S. Seifert, J. Freund, F. Kohl, "Ultrasensitive Flow Sensors for Liquids Using Thermal Microsystems", Eurosensors XIII, The 13th European Conference on Solid-State Transducers, p. 691(1999).

Integrated circuit sensors derive temperature from the known temperature dependence of the forward voltage of silicon junctions. CMOS thermometers operating at 3 V are commercially available. Low supply currents, well below 50 μA, generate very low self-heating—less than 0.1° C. National Semiconductor offers a low power CMOS thermometer which operates at 3V drawing<10 microA (NSC part no. LM19). Cost is $0.20 in quantities of <1000. Analog Devices manufactures a CMOS thermometer with a built-in shutdown function which cuts supply current to less than 0.5 μA.[9]

[9] Part no. TMP35/TMP36/TMP37, Analog Devices, Norwood, Mass.

Relative humidity sensors detect the change in a material property in response to absorption of atmospheric moisture. The material property of interest may be dielectric function as in capacitance gauges, electrical impedance in resistive humidity sensors, or thermal conductivity. Capacitive relative humidity (RH) sensors are simple devices used in many industrial and meteorological applications. Capacitive RH sensors have low temperature coefficients, and low power consumption (<10 microA).

Standard MEMS shock sensors are based on capacitive, piezoresistive, and piezoelectric measurements. An external electrical power source is required for variable capacitance sensors or bridge-type piezoresistive devices. However, piezoelectric (PE) generate an electrical signal without drawing current from an external electrical power supply. The high impedance output signal from a PE sensor makes detection susceptible to electromagnetic noise, and needs to be addressed in the measurement circuitry.

Many sensors also have on-board power, e.g., batteries. Of common, available batteries, lithium primary cells are have been used to meet extended battery lifetimes. Lithium batteries have 3V operating voltage and high energy density, long (>10 year) shelf life, good low temperature operation and excellent leakage resistance. They are also suitable for pulse discharge, should it be desired to duty cycle the sensor suite.

A long battery life requires a low average current drain. A low average current drain may be achieved by either extremely low constant drain current for always-on devices, or by duty cycling the sensor suite to higher operating currents by using a very low power clock relay. Energy densities for commercially available lithium coin cells range from 25–1700 mAh, and the capacity of the most typical lithium battery is 300–400 mAh. Considering a 400 mAh cell (Tadiran TL-5186), to approach a ten year battery lifetime, the average current drain must be less than 4.5 microamps. This is an extremely low operating current and outside the requirements for available accelerometers (shock sensors). Either a larger and more expensive cylindrical battery must be used (available up to 19 Ah), or the sensor suite must be triggered or duty cycled. While temperature and humidity are slowly changing variables suitable for sampling rates as low as hourly or less, an impact is a random event. A shock sensor must either be always on, or must be capable of rapid start-up after a trigger impulse. Package impacts are relatively short duration events (5–30 msec), thus a triggered impact sensor must be capable of sub-millisecond response from a sleep mode. Dallas Semiconductor DS1306E is a real time clock with alarm and operates with an average power drain of 1 microW, guaranteeing an overall sleep power dissipation of 1 microW.

Room-temperature drainage curves indicate that a ten year operational lifetime is possible for 3V lithium batteries if the drain current is <30 microamps.[10] Continuous operation in very cold conditions (−21 C.) will reduce the lifetime by about one order of magnitude.

[10] http://data.energizer.com/datasheets/_partof/splash.htm

To accommodate mass use of the aforementioned MEMS, and to integrate MEMS into many more aspects of everyday life, therefore, more economical manufacturing methods are needed. Manufacturing MEMS based on chip-scale techniques, or wafer scale techniques employing conventional thinning techniques, are not likely suitable for economical MEMS integration.

OBJECTS OF THE INVENTION

Accordingly, a primary object of the present invention is to provide low cost MEMS.

Another object of the present invention is to provide vertically integrated MEMS.

It is another object of the invention is to provide a vertically integrated MEMS including one or more MEMS devices and associated electronics, optical systems, photovoltaics, electrochemical cells, thermal management, communication systems and/or other functionality.

A further object of the present invention is to provide a method of manufacturing MEMS and vertically integrated MEMS, generally wherein a device layer is provided on a support layer in a condition to allow processing of MEMS, microelectronics and/or other structures.

It is another object of the invention is to provide a method of manufacturing MEMS and vertically integrated MEMS, wherein a device layer is provided on a support layer in a condition to allow processing of MEMS, microelectronics and/or other structures, such that the device layer with the structures formed therein or thereon is readily removable (e.g., by peeling) from the support layer without damaging, or minimally damaging, the structures formed on the device layer, whereby the device layer may form a MEMS, or multiple device layers of different or similar useful structures may be aligned and stacked to form a vertically integrated MEMS suite.

SUMMARY OF THE INVENTION

The above-discussed and other problems and deficiencies of the prior art are overcome or alleviated, and the objects of the invention are attained, by the several methods and devices of the present invention. Wafer-scale removal, transfer and stacking of the thin device layers provides an effective and efficient system for 3-dimensional integration of MEMS. Wafer bonding and debonding is employed to manufacture a customizable wafer enable economical 3-Dimensional integration of devices.

A MEMS device or suite of devices is fabricated using a multiple layer substrate includes a first layer selectively attached or bonded to a second layer. The layer is preferably a layer of a wafer. This process uses a starting substrate wafer designed to allow for removal and transfer of a thin "useful" layer without damage to a processed device on the useful layer. The technology can be used both to simplify and enable design process, and to enable vertical integration of sensors and controllers on a wafer level. With simplified thin layer transfer using selective bonding technology, designs are made straightforward. Inexpensive, flexible integration of any MEMS sensor and actuator, as well as MEMS and microelectronics hybrids, is thus attained. The technology is extendable to creating extremely high density microelectronics.

The selective bonding approach opens up the design process by providing a cost-effective means to generate and transfer thin layers, for forming a massively fillo leaf structure (MFT). Formerly complicated process steps can be broken apart into simple steps. The difficulty of undercutting and other conventional lift-off techniques can be replaced by peeling off the component layers and stacking them one at a time, on a wafer scale. Thus, with the laminated starting wafer, it is possible to transfer any layer. The selective bonding process may be applied to component layers, and further to wafer-scale transfer of entire completed hybrid devices include MEMS and microprocessing systems, among other things, thereby effectively bringing integration to MEMS technology.

A method of making MEMS generally comprises selectively adhering a first layer optionally having a useful structure thereon or therein to a second support layer, removing the first layer, repeating the process with a similar or dissimilar useful structure (or none at all), and stacking a plurality of the layers to form a 3-Dimensional integrated structure.

This method allows for production of inexpensive microelectronics, MEMS sensors, MEMS actuators, hybrid MEMS-microelectronics, or any combination thereof.

The above discussed and other features and advantages of the present invention will be appreciated and understood by those skilled in the art from the following detailed description and drawings.

BRIEF DESCRIPTION OF THE DRAWINGS

FIGS. 14–20 depict various bonding geometries for the structure of FIG. 1;

FIGS. 21–32 depict various debonding techniques;

FIGS. 29–34 depict steps of forming a vertically integrated MEMS; and

DETAILED DESCRIPTION OF THE ILLUSTRATIVE EMBODIMENTS

Figure 1:
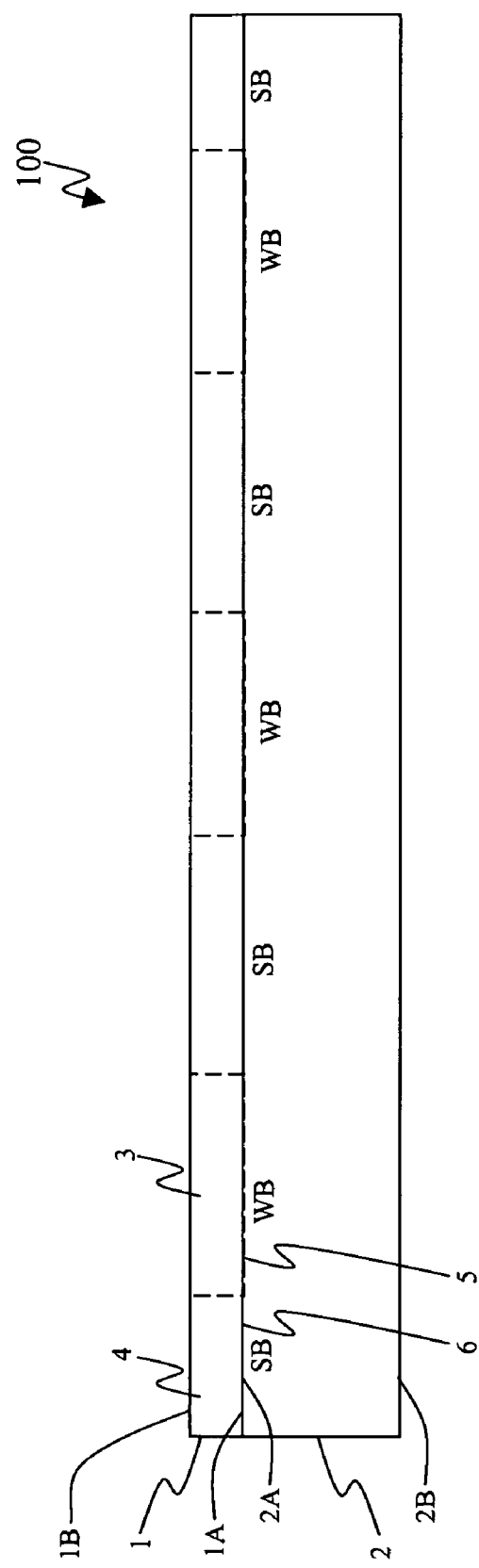
FIG. 1 is a schematic representation of an embodiment of a layered structure described herein suitable for forming MEMS and other associated micro devices.

MEMS devices are vertically stacked in the present invention, providing 3D-integration of other micro systems (including, but not limited to microelectronics, microfluidics, thermal management, and the like). The critical dimensions of MEMS devices are quite large in comparison to state of the art CMOS, significantly relaxing wafer level alignment criteria. Also, the number of required pins for a given device are comparatively few, simplifying vertical interconnection as compared to vertically integrated microelectroncis. For example, commercially available thermometer[11] and hygrometer[12] chips require only a single, twisted pair of leads for both power and data communication. Vertical interconnects can be made large, which has a significant positive impact on reliability. Another aspect of MEMS sensors that favors stacking is that power consumption is relatively low for MEMS sensors, making thermal management straightforward.

[11] 1-wire™ technology, Maxim Integrated Products, Sunnyvale, Calif., part no. DS1820 (thermometer).

[12] Dan Awtrey, "A 1-Wire Humidity Sensor", Sensors, Vol. 17(8), August 2000.

By employing the present manufacturing methods and utilizing wafer-scale bonding, costs of vertical integration is the same and ultimately will be drastically less than costs of forming discrete devices.

A vertically-integrated MEMS suite, for example including one or more sensors, optical switches, communication systems (e.g., antennae, transmitters) or other functionality MEMS is disclosed. The manufacturing method is flexible such that any MEMS hybrid combination may be manufactured, facilitating design upgrades. The method reduces costs of integrated MEMS, allowing usage in new classes of applications.

In general, bond strengths are controlled to create a starting wafer which allows for removal and transfer of the entire device layer after completion. These bonded wafers are designed to withstand device processing, and still allow peeling of the thin device layer on a wafer scale, without difficult grinding and etching.

A new method for manufacturing SOI wafers utilizes transfer of a thin layer from a silicon wafer by controlled cleavage along planes of ion implant damage. Generally, this layer is permanently bonded to an oxidized silicon wafer to form a silicon-oxide-silicon laminate. The bond is made without adhesives. As an alternative to forming a permanent bond, the bond strength can be controlled either across the entire wafer face, or in selected patterns of strong and weak bonding areas. For example, the bond energy can be controlled by nanoscale roughening. These wafers with an internal plane of controlled energy are to be used to fabricate reliable sensor designs. After fabrication, each thin sensor device layer is to be transferred to a handle wafer. The transfer and bonding of the device layer occurs on wafer scale, that is, the entire top layer is transferred in one piece and direct bonded to the handle wafer. Additional layers of sensors or controllers can be stacked onto the handle wafer over the originally transferred layer to create a 3-D sensor suite. This approach allows for any type of sensor to be integrated into a stacked suite.

Referring to FIG. 1, a selectively bonded multiple layer substrate 100 is shown. The multiple layer substrate 100 includes a layer 1 having an exposed surface 1B, and a surface 1A selectively bonded to a surface 2A of a layer 2. Layer 2 further includes an opposing surface 2B. In general, to form the selectively bonded multiple layer substrate 100, layer 1, layer 2, or both layers 1 and 2 are treated to define regions of weak bonding 5 and strong bonding 6, and subsequently bonded, wherein the regions of weak bonding 5 are in a condition to allow processing of a useful device or structure, including MEMS and/or other useful devices or structures.

In general, layers 1 and 2 are compatible. That is, the layers 1 and 2 constitute compatible thermal, mechanical, and/or crystalline properties. In certain preferred embodiments, layers 1 and 2 are the same materials. Of course, different materials may be employed, but preferably selected for compatibility.

One or more regions of layer 1 are defined to serve as the substrate region within or upon which one or more structures, such as microelectronics may be formed. These regions may be of any desired pattern, as described further herein. The selected regions of layer 1 may then be treated to minimize bonding, forming the weak bond regions 5. Alternatively, corresponding regions of layer 2 may be treated (in conjunction with treatment of layer 1, or instead of treatment to layer 1) to minimize bonding. Further alternatives include treating layer 1 and/or layer 2 in regions other than those selected to form the structures, so as to enhance the bond strength at the strong bond regions 6.

After treatment of layer 1 and/or layer 2, the layers may be aligned and bonded. The bonding may be by any suitable method, as described further herein. Additionally, the alignment may be mechanical, optical, or a combination thereof. It should be understood that the alignment at this stage may not, be critical, insomuch as there are generally no structures formed on layer 1. However, if both layers 1 and 2 are treated, alignment may be required to minimized variation from the selected substrate regions.

The multiple layer substrate 100 may processed to form a MEMS or any other desired structure in or upon layer 1. Accordingly, the multiple layer substrate 100 is formed such that the user may process any structure or device using conventional fabrication techniques, or other techniques that become known as the various related technologies develop. Certain fabrication techniques subject the substrate to extreme conditions, such as high temperatures, pressures, harsh chemicals, or a combination thereof. Thus, the multiple layer substrate 100 is preferably formed so as to withstand these conditions.

MEMS or other useful structures or devices may be formed in or upon regions 3, which partially or substantially overlap weak bond regions 5. Accordingly, regions 4, which partially or substantially overlap strong bond regions 6, generally do not have structures therein or thereon. After formation of MEMS or other useful devices within or upon layer 1 of the multiple layer substrate 100, layer 1 may subsequently be debonded. The debonding may be by any convenient method, such as peeling, without the need to directly subject the MEMS or other useful devices to detrimental delamination techniques. Since MEMS or other useful devices are not generally formed in or on regions 4, these regions may be subjected to debonding processing, such as ion or particle implantation, without detriment to the structures formed in or on regions 3.

To form weak bond regions 5, surfaces 1A, 2A, or both may be treated at the locale of weak bond regions 5 to form substantially no bonding or weak bonding. Alternatively, the weak bond regions 5 may be left untreated, whereby the strong bond region 6 is treated to induce strong bonding. Region 4 partially or substantially overlaps strong bond region 6. To form strong bond region 4, surfaces 1A, 2A, or both may be treated at the locale of strong bond region 6. Alternatively, the strong bond region 6 may be left untreated, whereby the weak bond region 5 is treated to induce weak bonding. Further, both regions 5 and 6 may be treated by different treatment techniques, wherein the treatments may differ qualitatively or quantitatively.

After treatment of one or both of the groups of weak bond regions 5 and strong bond regions 6, layers 1 and 2 are bonded together to form a substantially integral multiple layer substrate 100. Thus, as formed, multiple layer substrate 100 may be subjected to harsh environments by an end user, e.g., to form structures or devices therein or thereon, particularly in or on regions 3 of layer 1.

The phrase "weak bonding" or "weak bond" generally refers to a bond between layers or portions of layers that may be readily overcome, for example by debonding techniques such as peeling, other mechanical separation, heat, light, pressure, or combinations comprising at least one of the foregoing debonding techniques. These debonding techniques minimally defect or detriment the layers 1 and 2, particularly in the vicinity of weak bond regions 5.

The treatment of one or both of the groups of weak bond regions 5 and strong bond regions 6 may be effectuated by a variety of methods. The important aspect of the treatment is that weak bond regions 5 are more readily debonded (in a subsequent debonding step as described further herein) than the strong bond regions 6. This minimizes or prevents damage to the regions 3, which may include useful structures thereon, during debonding. Further, the inclusion of strong bond regions 6 enhances mechanical integrity of the multiple layer substrate 100 especially during structure processing. Accordingly, subsequent processing of the layer 1, when removed with useful structures therein or thereon, is minimized or eliminated.

The particular type of treatment of one or both of the groups of weak bond regions 5 and strong bond regions 6 undertaken generally depends on the materials selected. Further, the selection of the bonding technique of layers 1 and 2 may depend, at least in part, on the selected treatment methodology. Additionally, subsequent debonding may depend on factors such as the treatment technique, the bonding method, the materials, the type or existence of useful structures, or a combination comprising at least one of the foregoing factors. In certain embodiments, the selected combination of treatment, bonding, and subsequent debonding (i.e., which may be undertaken by an end user that forms useful structures in regions 3 or alternatively, as an intermediate component in a higher level device) obviates the need for cleavage propagation to debond layer 1 from layer 2 or mechanical thinning to remove layer 2, and preferably obviates both cleavage propagation and mechanical thinning. Accordingly, the underlying substrate may be reused with minimal or no processing, since cleavage propagation or mechanical thinning damages layer 2 according to conventional teachings, rendering it essentially useless without further substantial processing.

One treatment technique may rely on variation in surface roughness between the weak bond regions 5 and strong bond regions 6. The surface roughness may be modified at surface 1A (FIG. 4), surface 2A (FIG. 5), or both surfaces 1A and 2A. In general, the weak bond regions 5 have higher surface roughness (FIGS. 4 and 5) than the strong bond regions 6. In semiconductor materials, for example the weak bond regions 5 may have a surface roughness greater than about 0.5 nanometer (nm), and the strong bond regions 4 may have a lower surface roughness, generally less than about 0.5 nm. In another example, the weak bond regions 5 may have a surface roughness greater than about 1 nm, and the strong bond regions 4 may have a lower surface roughness, generally less than about 1 nm. In a further example, the weak bond regions 5 may have a surface roughness greater than about 5 nm, and the strong bond regions 4 may have a lower surface roughness, generally less than about 5 nm. Surface roughness can be modified by etching (e.g., in KOH or HF solutions) or deposition processes (e.g., low pressure chemical vapor deposition (LPCVD) or plasma enhanced chemical vapor deposition (PECVD)). The bonding strength associated with surface roughness is more fully described in, for example, Gui et al., "Selective Wafer Bonding by Surface Roughness Control", *Journal of The Electrochemical Society*, 148 (4) G225–G228 (2001), which is incorporated by reference herein.

Figure 4:
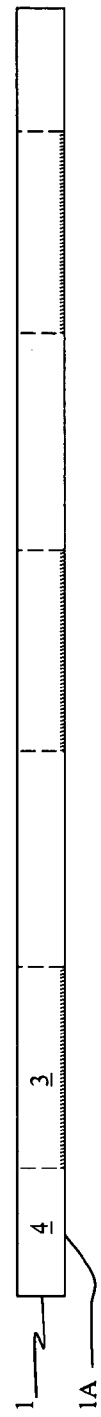
Figure 5:
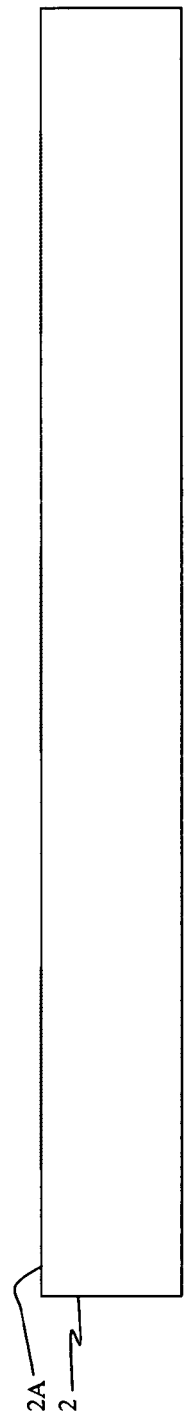

In a similar manner (wherein similarly situated regions are referenced with similar reference numbers as in FIGS. 4 and 5), a porous region 7 may be formed at the weak bond regions 5, and the strong bond regions 6 may remain untreated. Thus, layer 1 minimally bonds to layer 2 at locale of the weak bond regions 5 due to the porous nature thereof. The porosity may be modified at surface 1A (FIG. 4), surface 2A (FIG. 5), or both surfaces 1A and 2A. In general, the weak bond regions 5 have higher porosities at the porous regions 7 (FIGS. 4 and 5) than the strong bond regions 6.

Another treatment technique may rely on selective etching of the weak bond regions 5 (at surfaces 1A (FIG. 4), 2A (FIG. 5), or both 1A and 2A), followed by deposition of a photoresist or other carbon containing material (e.g., including a polymeric based decomposable material) in the etched regions. Again, similarly situated regions are referenced with similar reference numbers as in FIGS. 4 and 5. Upon bonding of layers 1 and 2, which is preferably at a temperature sufficient to decompose the carrier material, the weak bond regions 5 include a porous carbon material therein, thus the bond between layers 1 and 2 at the weak bond regions 5 is very weak as compared to the bond between layers 1 and 2 at the strong bond region 6. One skilled in the art will recognize that depending on the circumstances, a decomposing material will be selected that will not out-gas, foul, or otherwise contaminate the substrate layers 1 or 2, or any useful structure to be formed in or upon regions 3.

Figure 10:
Figure 11:
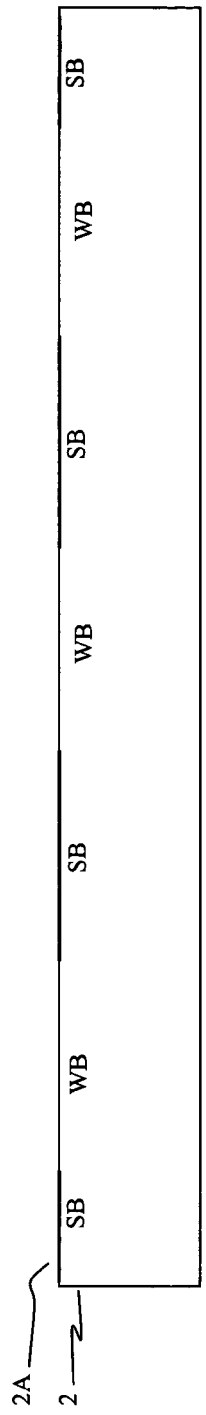

A further treatment technique may employ irradiation to attain strong bond regions 6 and/or weak bond regions 5. In this technique, layers 1 and/or 2 are irradiated with neutrons, ions, particle beams, or a combination thereof to achieve strong and/or weak bonding, as needed. For example, particles such as $He^+$, $H^+$, or other suitable ions or particles, electromagnetic energy, or laser beams may be irradiated at the strong bond regions 6 (at surfaces 1A (FIG. 10), 2A (FIG. 11), or both 1A and 2A). It should be understood that this method of irradiation differs from ion implantation for the purpose of delaminating a layer, generally in that the doses and/or implantation energies are much less (e.g., on the order of $1/100^{th}$ to $1/1000^{th}$ of the dosage used for delaminating).

Figure 2:
FIGS. 2–13 depict various treatment techniques for selective adhesion of the layers of the structure in FIG. 1.
Figure 3:
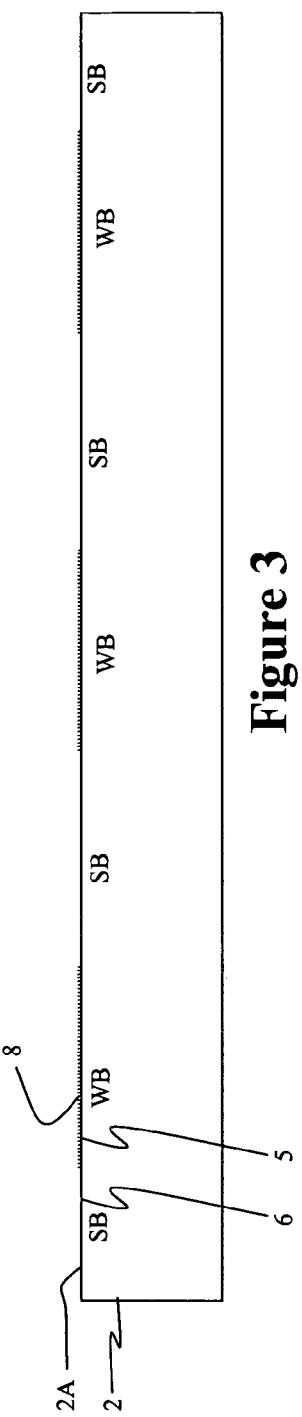

An additional treatment technique includes use of a slurry containing a solid component and a decomposable component on surface 1A, 2A, or both 1A and 2A. The solid component may be, for example, alumina, silicon oxide ($SiO(x)$), other solid metal or metal oxides, or other material that minimizes bonding of the layers 1 and 2. The decomposable component may be, for example, polyvinyl alcohol (PVA), or another suitable decomposable polymer. Generally, a slurry 8 is applied in weak bond region 5 at the surface 1A (FIG. 2), 2A (FIG. 3), or both 1A and 2A. Subsequently, layers 1 and/or 2 may be heated, preferably in an inert environment, to decompose the polymer. Accordingly, porous structures (comprised of the solid component of the slurry) remain at the weak bond regions 5, and upon bonding, layers 1 and 2 do not bond at the weak bond regions 5.

Figure 8:
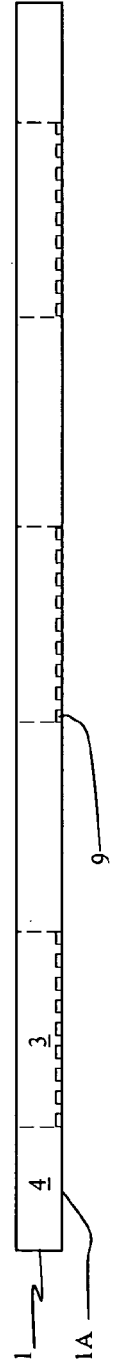
Figure 9:
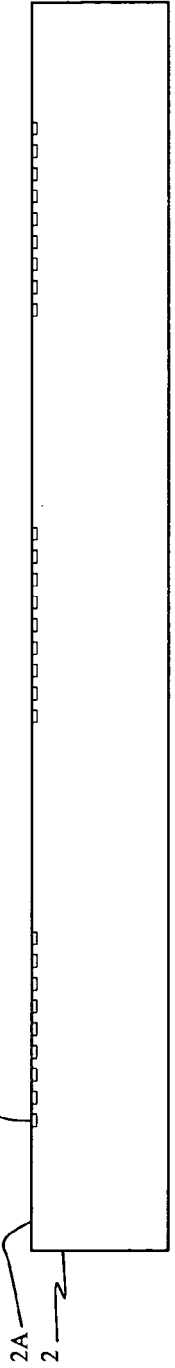

A still further treatment technique involves etching the surface of the weak bond regions 5. During this etching step, pillars 9 are defined in the weak bond regions 5 on surfaces 1A (FIG. 8), 2A (FIG. 9), or both 1A and 2A. The pillars may be defined by selective etching, leaving the pillars behind. The shaped of the pillars may be triangular, pyramid shaped, rectangular, hemispherical, or other suitable shape. Alternatively, the pillars may be grown or deposited in the etched region. Since there are less bonding sites for the material to bond, the overall bond strength at the weak bond region 5 is much weaker then the bonding at the strong bond regions 6.

Figure 12:
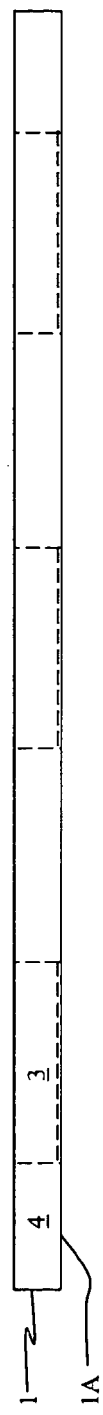
Figure 13:
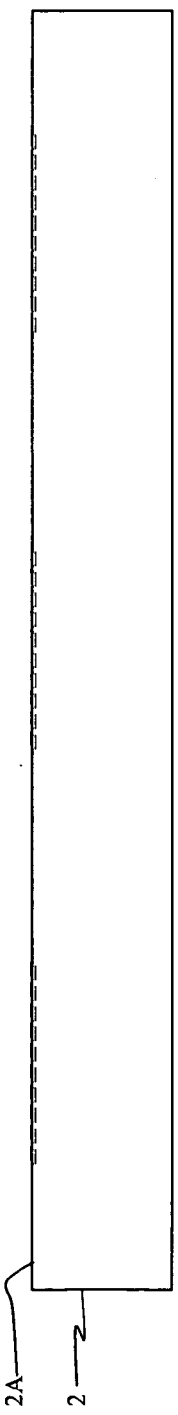

Yet another treatment technique involves inclusion of a void area 10 (FIGS. 12 and 13), e.g., formed by etching, machining, or both (depending on the materials used) at the weak bond regions 5 in layer 1 (FIG. 12), 2 (FIG. 13). Accordingly, when the first layer 1 is bonded to the second layer 2, the void areas 10 will minimize the bonding, as compared to the strong bond regions 6, which will facilitate subsequent debonding.

Another treatment technique involves use of one or more metal regions 8 at the weak bond regions 5 of surface 1A (FIG. 2), 2A (FIG. 3), or both 1A and 2A. For example, metals including but not limited to Cu, Au, Pt, or any combination or alloy thereof may be deposited on the weak bond regions 5. Upon bonding of layers 1 and 2, the weak bond regions 5 will be weakly bonded. The strong bond regions may remain untreated (wherein the bond strength difference provides the requisite strong bond to weak bond ratio with respect to weak bond layers 5 and strong bond regions 6), or may be treated as described above or below to promote strong adhesion.

A further treatment technique involves use of one or more adhesion promoters 11 at the strong bond regions 6 on surfaces 1A (FIG. 10), 2A (FIG. 11), or both 1A and 2A. Suitable adhesion promoters include, but are not limited to, $TiO(x)$, tantalum oxide, or other adhesion promoter. Alternatively, adhesion promoter may be used on substantially all of the surface 1A and/or 2A, wherein a metal material is be placed between the adhesion promoter and the surface 1A or 2A (depending on the locale of the adhesion promoter) at the weak bond regions 5. Upon bonding, therefore, the metal material will prevent strong bonding at the weak bond regions 5, whereas the adhesion promoter remaining at the strong bond regions 6 promotes strong bonding.

Yet another treatment technique involves providing varying regions of hydrophobicity and/or hydrophillicity. For example, hydrophilic regions are particularly useful for strong bond regions 6, since materials such as silicon may bond spontaneously at room temperature. Hydrophobic and hydrophilic bonding techniques are known, both at room temperature and at elevated temperatures, for example, as described in Q. Y. Tong, U. Goesle, *Semiconductor Wafer Bonding, Science and Technology*, pp. 49–135, John Wiley and Sons, New York, N.Y. 1999, which is incorporated by reference herein.

A still further treatment technique involves one or more exfoliation layers that are selectively irradiated. For example, one or more exfoliation layers may be placed on the surface 1A and/or 2A. Without irradiation, the exfoliation layer behaves as an adhesive. Upon exposure to irradiation, such as ultraviolet irradiation, in the weak bond regions 5, the adhesive characteristics are minimized. The useful structures may be formed in or upon the weak bond regions 5, and a subsequent ultraviolet irradiation step, or other debonding technique, may be used to separate the layers 1 and 2 at the strong bond regions 6.

Figure 6:
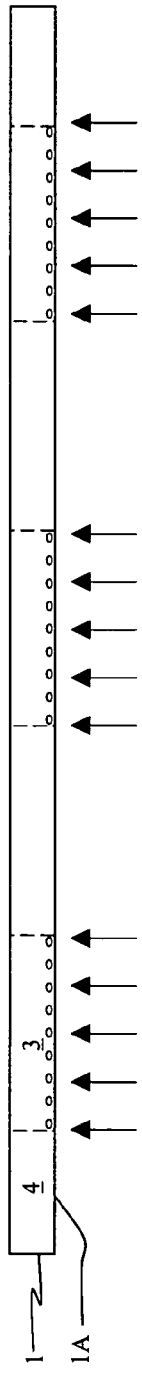
Figure 7:
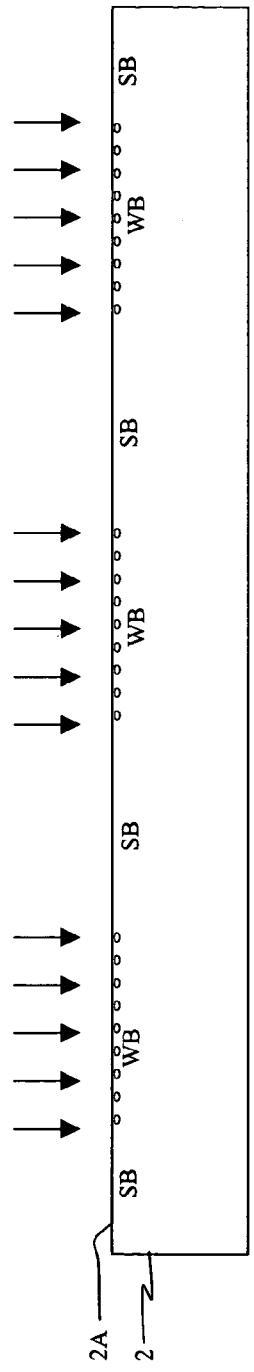

An additional treatment technique includes an implanting ions 12 (FIGS. 6 and 7) to allow formation of a plurality of microbubbles 13 in layer 1 (FIG. 6), layer 2 (FIG. 7), or both layers 1 and 2 in the weak regions 3, upon thermal treatment. Therefore, when layers 1 and 2 are bonded, the weak bond regions 5 will bond less than the strong bond regions 6, such that subsequent debonding of layers 1 and 2 at the weak bond regions 5 is facilitated.

Another treatment technique includes an ion implantation step followed by an etching step. In one embodiment, this technique is carried out with ion implantation through substantially all of the surface 1B. Subsequently, the weak bond regions 5 may be selectively etched. This method is described with reference to damage selective etching to remove defects in Simpson et al., "Implantation Induced Selective Chemical Etching of Indium Phosphide", Electrochemical and Solid-State Letters, 4(3) G26–G27, which is incorporated by reference herein.

A further treatment technique realizes one or more layers selectively positioned at weak bond regions 5 and/or strong bond regions 6 having radiation absorbing and/or reflective characteristics, which may be based on narrow or broad wavelength ranges. For example, one or more layers selectively positioned at strong bond regions 6 may have adhesive characteristics upon exposure to certain radiation wavelengths, such that the layer absorbs the radiation and bonds layers 1 and 2 at strong bond regions 6.

One of skill in the art will recognize that additional treatment technique may be employed, as well as combination comprising at least one of the foregoing treatment techniques. The key feature of any treatment employed, however, is the ability to form one or more region of weak bonding and one or more regions of strong bonding.

Figure 16:
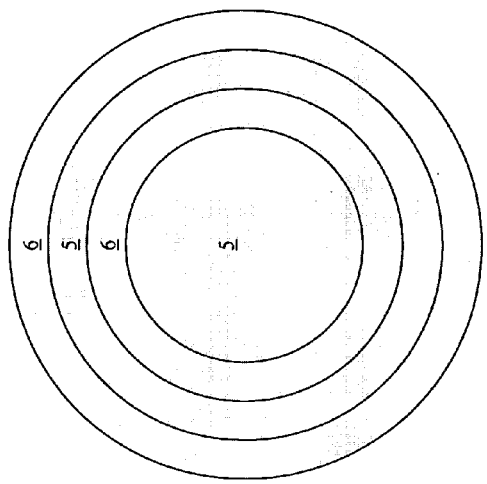
Figure 15:
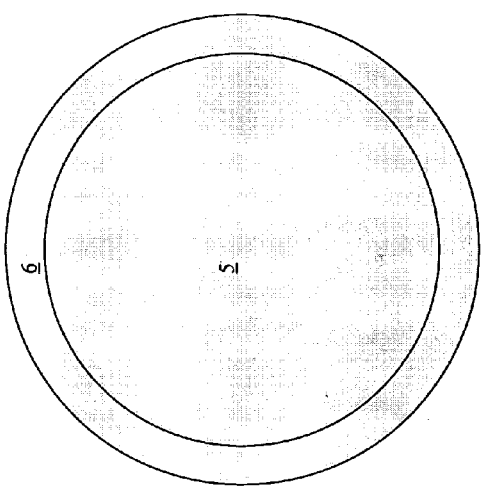
Figure 14:
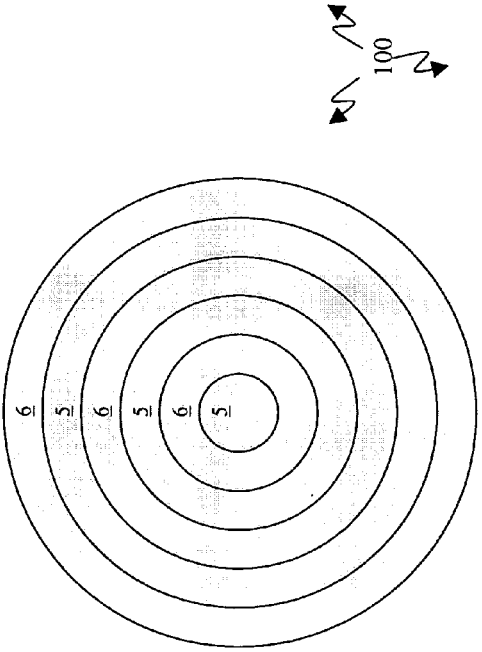

The geometry of the weak bond regions 5 and the strong bond regions 6 at the interface of layers 1 and 2 may vary depending on factors including, but not limited to, the type of useful structures formed on or in regions 3, the type of debonding/bonding selected, the treatment technique selected, and other factors. As shown in FIGS. 14–16, the regions 5,6 may be concentric. Of course, one of skill in the art will appreciate that any geometry may be selected. Furthermore, the ratio of the areas of weak bonding as compared to areas of strong bonding may vary. In general, the ratio provides sufficient bonding (i.e., at the strong bond regions 6) so as not to comprise the integrity of the multiple layer structure 100, especially during structure processing. Preferably, the ratio also maximizes useful regions (i.e., weak bond region 5) for structure processing.

After treatment of one or both of the surfaces 1A and 2A in substantially the locale of weak bond regions 5 and/or strong bond regions 6 as described above, layers 1 and 2 are bonded together to form a substantially integral multiple layer substrate 100. Layers 1 and 2 may be bonded together by one of a variety of techniques and/or physical phenomenon, including but not limited to, eutectic, fusion, anodic, vacuum, Van der Waals, chemical adhesion, hydrophobic phenomenon, hydrophilic phenomenon, hydrogen bonding, coulombic forces, capillary forces, very short-ranged forces, or a combination comprising at least one of the foregoing bonding techniques and/or physical phenomenon. Of course, it will be apparent to one of skill in the art that the bonding technique and/or physical phenomenon may depend in part on the one or more treatments techniques employed, the type or existence of useful structures formed thereon or therein, anticipated debonding method, or other factors.

Multiple layers substrate 100 thus may be used to form MEMS or one or more other useful structures in or upon regions 3, which substantially or partially overlap weak bond regions 5 at the interface of surfaces 1A and 2A. The useful structures may include one or more active or passive elements, devices, implements, tools, channels, other useful structures, or any combination comprising at least one of the foregoing useful structures. For instance, the useful structure may include an integrated circuit or a solar cell. Of course, one of skill in the art will appreciate that various microtechnology and nanotechnology based device may be formed, including MEMS for various purposes, such as sensors, switches, mirrors, micromotors, microfans, and other MEMS.

After one or more structures have been formed on one or more selected regions 3 of layer 1, layer 1 may be debonded by a variety of methods. It will be appreciated that since the structures are formed in or upon the regions 4, which partially or substantially overlap weak bond regions 5, debonding of layer 1 can take place while minimizing or eliminating typical detriments to the structures associated with debonding, such as structural defects or deformations.

Debonding may be accomplished by a variety of known techniques. In general, debonding may depend, at least in part, on the treatment technique, bonding technique, materials, type or existence of useful structures, or other factors.

Referring in general to FIGS. 17–28, debonding techniques may based on implantation of ions or particles to form microbubbles at a reference depth, generally equivalent to thickness of the layer 1. The ions or particles may be derived from oxygen, hydrogen, helium, or other particles 14. The impanation may be followed by exposure to strong electromagnetic radiation, heat, light (e.g., infrared or ultraviolet), pressure, or a combination comprising at least one of the foregoing, to cause the particles or ions to form the microbubbles 15, and ultimately to expand and delaminate the layers 1 and 2. The implantation and optionally heat, light, and/or pressure may also be followed by a mechanical separation step (FIGS. 19, 22, 25, 28), for example, in a direction normal to the plane of the layers 1 and 2, parallel to the plane of the layers 1 and 2, at another angle with to the plane of the layers 1 and 2, in a peeling direction (indicated by broken lines in FIG. 19, 22, 25, 28), or a combination thereof. Ion implantation for separation of thin layers is described in further detail, for example, in Cheung, et al. U.S. Pat. No. 6,027,988 entitled "Method Of Separating Films From Bulk Substrates By Plasma Immersion Ion Implantation", which is incorporated by reference herein. Typical implant conditions for hydrogen are a dose of $5 \times 10^6$ cm$^{-2}$ and energy of 120 keV. For the above conditions, about 1 micron layer thickness can be cleaved from the wafer. The layer thickness is a function of the implant depth only, which for hydrogen in silicon is 90 Å/keV of implant energy.[13] The implantation of high energy particles heats the target significantly. Blistering is preferably avoided when implanting hydrogen by reducing beam currents by a factor of ½ or more, or by clamping and cooling the wafer. Splitting with lower hydrogen implant doses has been achieved with co-implantation of helium[14] or boron (Smarter-Cut process).[15] While this technology has been commercialized to manufacture SOI wafers, there remain vast opportunities in 3-dimensional integration of microelectronics, in machining microelectromechanical devices, in optical devices and more.

[13] M. Bruel, "Process for the production of thin semiconductor material films", U.S. Pat. No. 5,374,564 (1994).

[14] He+H co-implant

[15] Q.-Y. Tong, R. Scholz, U. Goesele, T.-H. Lee, L.-J. Huang, Y.-L. Chao, and T. Y. Tan, "A 'smarter-cut' approach to low temperature silicon layer transfer", Appl. Phys. Lett., 72, 49 (1998).

The surface quality of the cleaved surface is reported to be excellent.[16] A thin layer is split away along microcracks formed by the implantation of hydrogen ions. The splitting may be done by thermal treatment which increases the internal pressure in hydrogen microbubbles in the lattice, or mechanical stress may be employed to initiate and propagate the fracture. Microelectronic devices are highly sensitive to implant damage, and therefore the technique is used exclusively to prepare starting wafers, and is never performed on completed or in-process wafers. Furthermore, a high energy ion implant through a structured wafer would result in a more diffuse implant depth profile. The incident ions will experience different materials and topographies, and thus the range parameter will be dependent on wafer location.

[16] Smart cut surface quality

Figure 20:
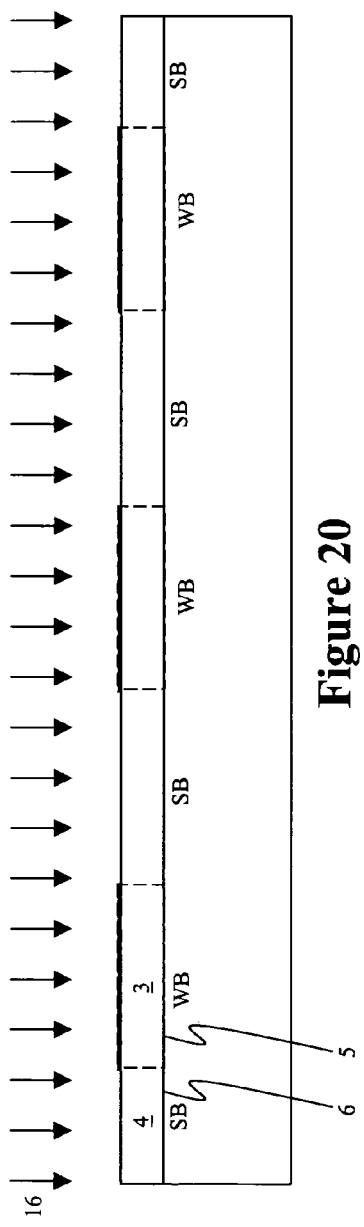
Figure 21:
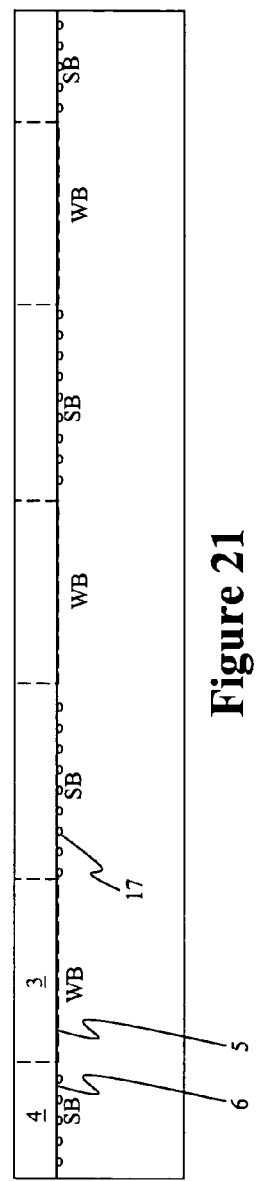
Figure 22:
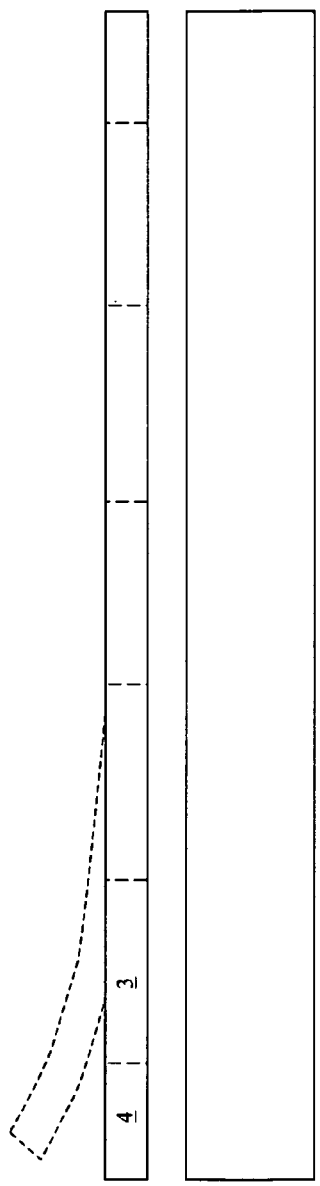

Referring particularly to FIGS. 17–19 and 20–22, the interface between layers 1 and 2 may be implanted with ions or particles 16 selectively, particularly to form microbubbles 17 at the strong bond regions 6. In this manner, implantation of particles 16 at regions 3 (having one or more useful structures therein or thereon) is minimized, thus reducing the likelihood of repairable or irreparable damage that may occur to one or more useful structures in regions 3. Selective implantation may be carried out by selective ion beam scanning of the strong bond regions 4 (FIGS. 17–19) or masking of the regions 3 (FIGS. 20–22). Selective ion beam scanning refers to mechanical manipulation of the structure 100 and/or a device used to direct ions or particles to be implanted. As is known to those skilled in the art, various apparatus and techniques may be employed to carry out selective scanning, including but not limited to focused ion beam and electromagnetic beams. Further, various masking materials and technique are also well known in the art.

Figure 23:
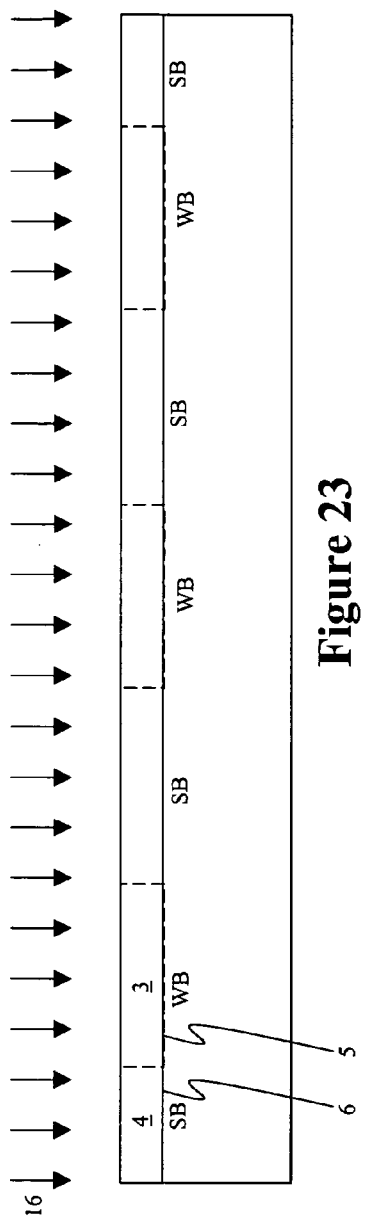
Figure 24:
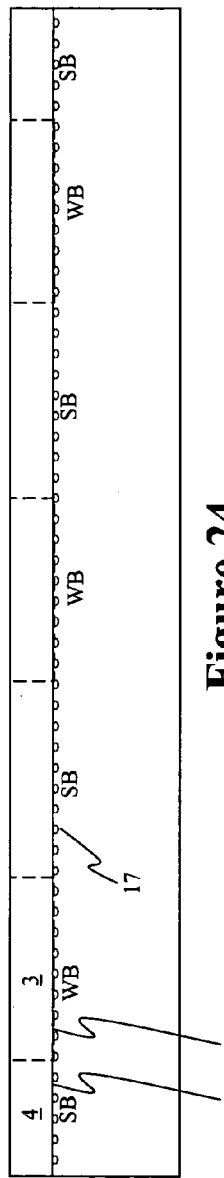
Figure 25:
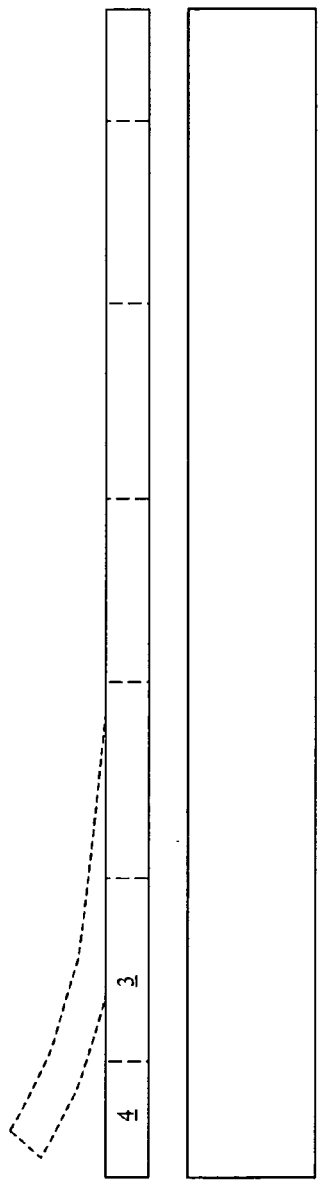

Referring to FIGS. 23–25, the implantation may be effectuated substantially across the entire the surface 1B or 2B. Implantation is at suitable levels depending on the target and implanted materials and desired depth of implantation. Thus, where layer 2 is much thicker than layer 1, it may not be practical to implant through surface 2B; however, if layer 2 is a suitable implantation thickness (e.g., within feasible implantation energies), it may be desirable to implant through the surface 2B. This minimizes or eliminates possibility of repairable or irreparable damage that may occur to one or more useful structures in regions 3.

In one embodiment, and referring to FIGS. 15 and 26–28, strong bond regions 6 are formed at the outer periphery of the interface between layers 1 and 2. Accordingly, to debond layer 1 form layer 2, ions or particles 16 may be implanted, for example, through region 4 to form microbubbles 17 at the interface of layers 1 and 2. Preferably, selective scanning is used, wherein the structure 100 may be rotated (indicated by arrow 20), a scanning device 21 may be rotated (indicated by arrow 22), or a combination thereof. In this embodiment, a further advantage is the flexibility afforded the end user in selecting useful structures for formation therein or thereon. The dimensions of the strong bond region 6 (i.e., the width) are suitable to maintain mechanical and thermal integrity of the multiple layer substrate 100. Preferably, the dimension of the strong bond region 6 is minimized, thus maximizing the area of weak bond region 5 for structure processing. For example, strong bond region 6 may be about one (1) micron of an eight (8) inch water.

Further, debonding of layer 1 from layer 2 may be initiated by other conventional methods, such as etching (parallel to surface), for example, to form an etch through strong bond regions 6. In such embodiments, the treatment technique is particularly compatible, for example wherein the strong bond region 6 is treated with an oxide layer that has a much higher etch selectivity that the bulk material (i.e., layers 1 and 2). The weak bond regions 5 preferably do not require etching to debond layer 1 from layer 2 at the locale of weak bond regions 5, since the selected treatment, or lack thereof, prevented bonding in the step of bonding layer 1 to layer 2.

Alternatively, cleavage propagation may be used to initiate debonding of layer 1 from layer 2. Again, the debonding preferably is only required at the locale of the strong bond regions 6, since the bond at the weak bond regions 5 is limited. Further, debonding may be initiated by etching (normal to surface), as is conventionally known, preferably limited to the locales of regions 4 (i.e., partially or substantially overlapping the strong bond regions 6).

Layers 1 and 2 may be the same or different materials, and may include materials including, but not limited to, plastic (e.g., polycarbonate), metal, semiconductor, insulator, monocrystalline, amorphous, noncrystalline, biological (e.g., DNA based films) or a combination comprising at least one of the foregoing types of materials. For example, specific types of materials include silicon (e.g., monocrystalline, polycrystalline, noncrystalline, polysilicon, and derivatives such as $Si_3N_4$, SiC, $SiO_2$), GaAs, InP, CdSe, CdTe, SiGe, GaAsP, GaN, SiC, GaAlAs, InAs, AlGaSb, InGaAs, ZnS, AlN, TiN, other group IIIA–VA materials, group IIB materials, group VIA materials, sapphire, quartz (crystal or glass), diamond, silica and/or silicate based material, or any combination comprising at least one of the foregoing materials. Of course, processing of other types of materials may benefit from the process described herein to provide multiple layer substrates 100 of desired composition. Preferred materials which are particularly suitable for the herein described methods include semiconductor material (e.g., silicon) as layer 1, and semiconductor material (e.g., silicon) as layer 2, other combinations include, but are not limited to; semiconductor (layer 1) or glass (layer 2); semiconductor (layer 1) on silicon carbide (layer 2) semiconductor (layer 1) on sapphire (layer 2); GaN (layer 1) on sapphire (layer 2); GaN (layer 1) on glass (layer 2); GaN (layer 1) on silicon carbide (layer 2); plastic (layer 1) on plastic (layer 2), wherein layers 1 and 2 may be the same or different plastics; and plastic (layer 1) on glass (layer 2).

Layers 1 and 2 may be derived from various sources, including wafers or fluid material deposited to form films and/or substrate structures. Where the starting material is in the form of a wafer, any conventional process may be used to derive layers 1 and/or 2. For example, layer 2 may consist of a wafer, and layer 1 may comprise a portion of the same or different wafer. The portion of the wafer constituting layer 1 may be derived from mechanical thinning (e.g., mechanical grinding, cutting, polishing; chemical-mechanical polishing; polish-stop; or combinations including at least one of the foregoing), cleavage propagation, ion implantation followed by mechanical separation (e.g., cleavage propagation, normal to the plane of structure 100, parallel to the plane of structure 100, in a peeling direction, or a combination thereof), ion implantation followed by heat, light, and/or pressure induced layer splitting), chemical etching, or the like. Further, either or both layers 1 and 2 may be deposited or grown, for example by chemical vapor deposition, epitaxial growth methods, or the like.

An important benefit of the instant method and resulting multiple layer substrate having MEMS or other useful structures thereon is that the useful structures are formed in or upon the regions 3, which partially or substantially overlap the weak bond regions 5. This substantially minimizes or eliminates likelihood of damage to the useful structures when the layer 1 is removed from layer 2. The debonding step generally requires intrusion (e.g., with ion implantation), force application, or other techniques required to debond layers 1 and 2. Since, in certain embodiments, the structures are in or upon regions 3 that do not need local intrusion, force application, or other process steps that may damage, reparably or irreparable, the structures, the layer 1 may be removed, and structures derived therefrom, without subsequent processing to repair the structures. The regions 4 partially or substantially overlapping the strong bond regions 6 do generally not have structures thereon, therefore these regions 4 may be subjected to intrusion or force without damage to the structures.

The layer 1 may be removed as a self supported film or a supported film. For example, handles are commonly employed for attachment to layer 1 such that layer 1 may be removed from layer 2, and remain supported by the handle. Generally, the handle may be used to subsequently place the film or a portion thereof (e.g., having one or more useful structures) on an intended substrate, another processed film, or alternatively remain on the handle. One such handle is described in U.S. Provisional Patent Application Ser. No. 60/326,432 filed on Oct. 2, 2001 entitled "Device And Method For Handling Fragile Objects, And Manufacturing Method Thereof", which is incorporated by reference herein.

One benefit of the instant method is that the material constituting layer 2 is may be reused and recycled. A single wafer may be used, for example, to derive layer 1 by any known method. The derived layer 1 may be selectively bonded to the remaining portion (layer 2) as described above. When the thin film is debonded, the process is repeated, using the remaining portion of layer 2 to obtain a thin film to be used as the next layer 1. This may be repeated until it no longer becomes feasible or practical to use the remaining portion of layer 2 to derive a thin film for layer 1.

As discussed above, MEMS devices are a natural choice for vertical stacking. The challenges for 3-D integration of a MEMS sensor suite are more readily addressed than in microelectronics. The critical dimensions are large and I/O counts are small for MEMS devices. Vertical interconnects can be made large, which has a significant positive impact on reliability of inter-device vertical connections with no penalty in increased chip size. Wafer bonding is an established step of MEMS fabrication. Power consumption can be relatively low for MEMS sensors, making thermal management much easier. For example, in certain embodiments, the average power consumption may be less than 100 microwatts (3V, average current drain<30 microA), removing thermal management of the stacked suite as a significant issue. Since the a thin device layer is transferred, vertical interconnects can be implemented easily by throughhole technology for a MEMS.

The multiple layer substrate enables economical stacking of thinned devices into a single package. The thinning of the devices is achieved by wafer-scale peeling of the device layer from the multiple layer substrate.

Thus, according to the methods herein, device layers may be removed from fully bonded wafers. The method does not require ion implanting through completed wafers, backgrinding the wafer, or etching the wafer due to the selective bonding processes described above. In-plane, controlled cleavage (e.g., peeling) will separate the thin, completed device layer from the bulk of the wafer. The transfer of the devices can be achieved on wafer-scale. During the thin-layer transfer, the device layer is bonded to another wafer having the same or different devices, or to any surface. The devices may be other MEM sensors, or the wafer may contain ASIC controllers or memory chips. This approach removes design constraints, and allows the selection of sensors to be discretely optimized. The design has an open architecture allowing selection of best-of-class sensors. Design changes to the suite can be made with minimal cost, by simply replacing a layer or plurality of layers.

Sensors may be provided in the form of commercially available sensors, or may be designed for fabrication on a separate wafer or wafers, with die dimensions designed to match the substrate wafer with the commodity sensors. The starting wafer is to be designed with a debonding plane for facilitated removal of the device layer, and transfer to the primary wafer, where it may be fusion bonded. Additional layers of sensors and/or control circuitry can be added, as needed. Backgrind will not be necessary. The wafer bond pads are designed in vertical alignment. Pins count is to be reduced as much as possible by designing pins in parallel. Since the layers are to be very thin, throughhole vias are a practical solution to form 3-D interconnects. Further, an edge connection design may be. After optional passivation, the wafer is ready for back end fabrication (dicing, wire bonding, etc.).

Figure 29:
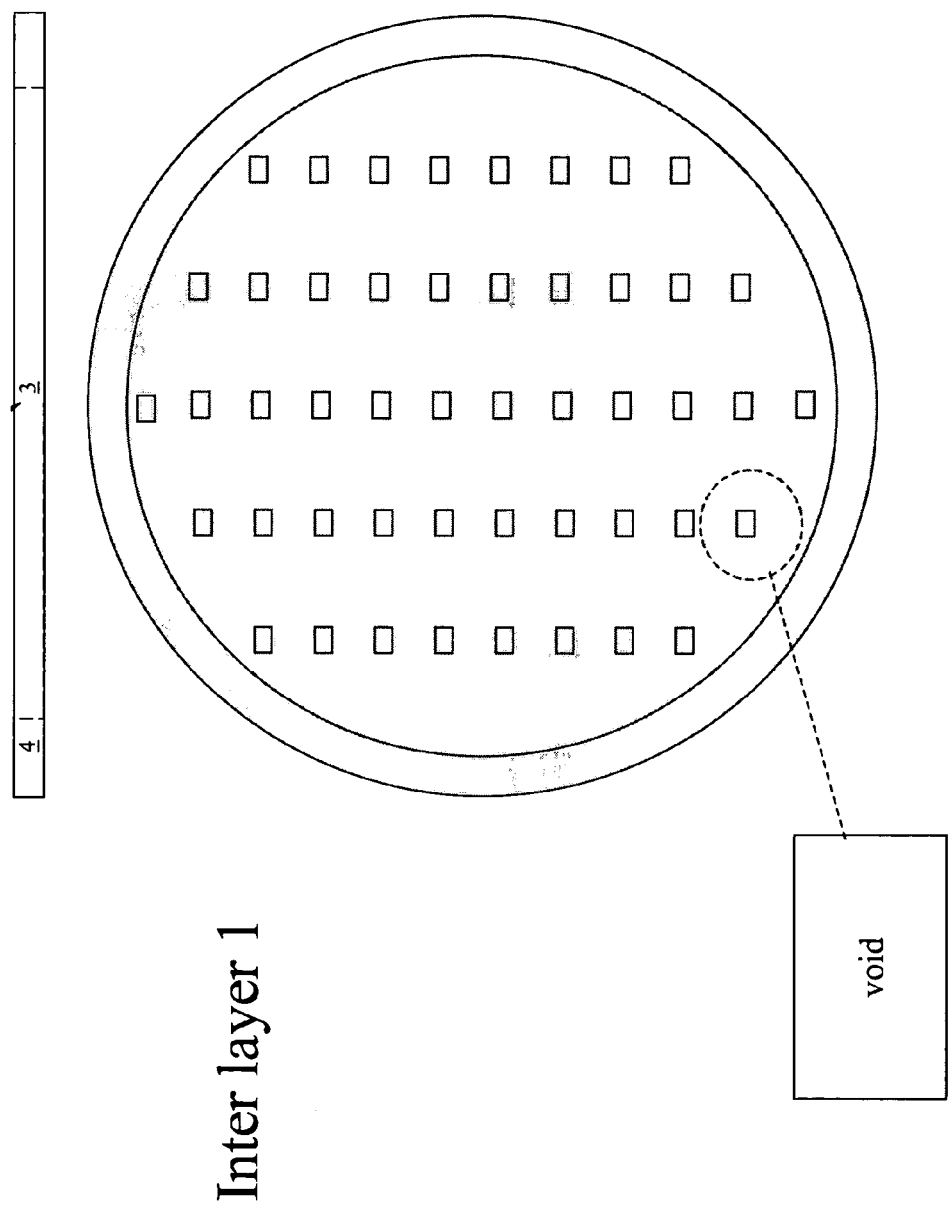
Figure 30:
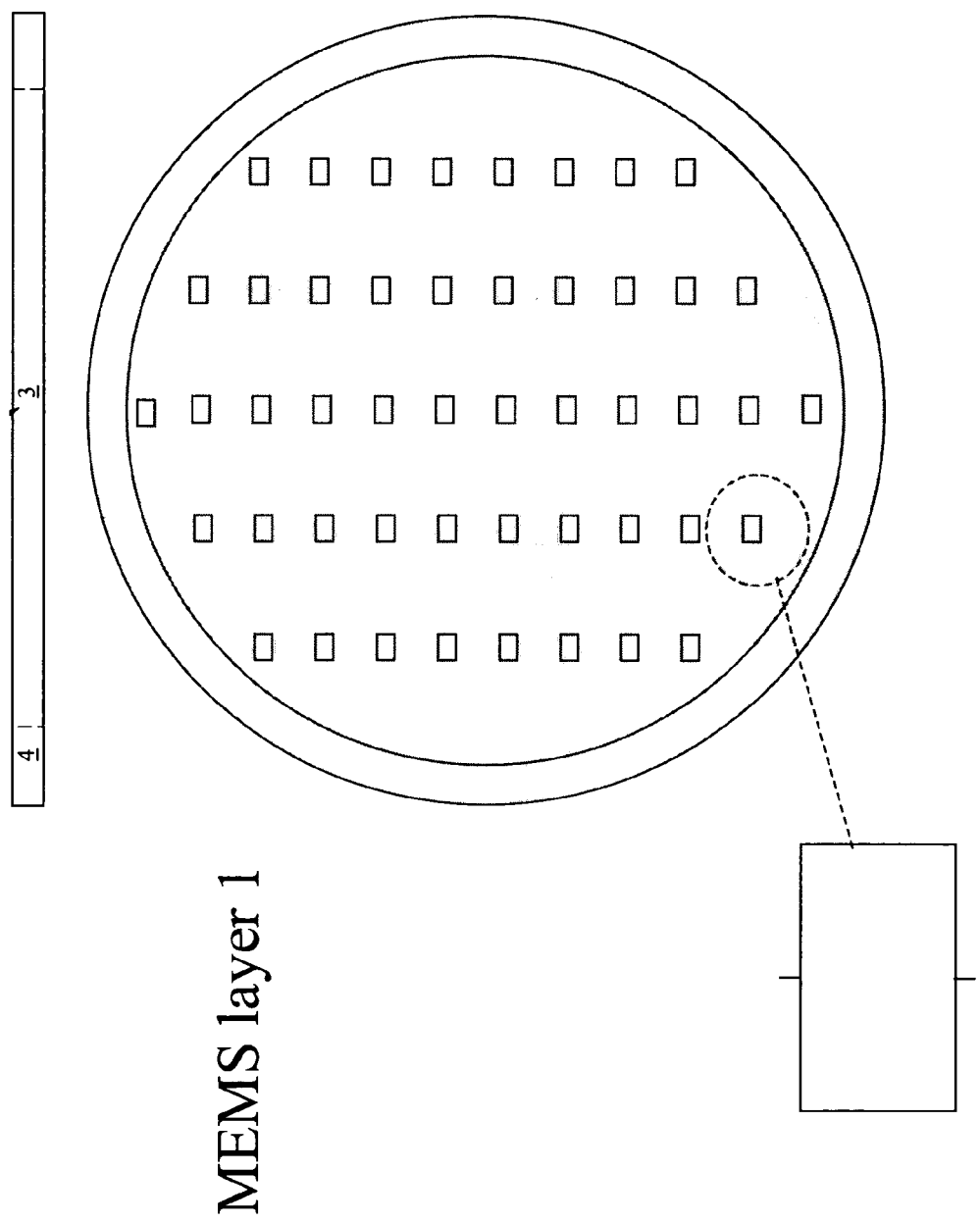
Figure 31:
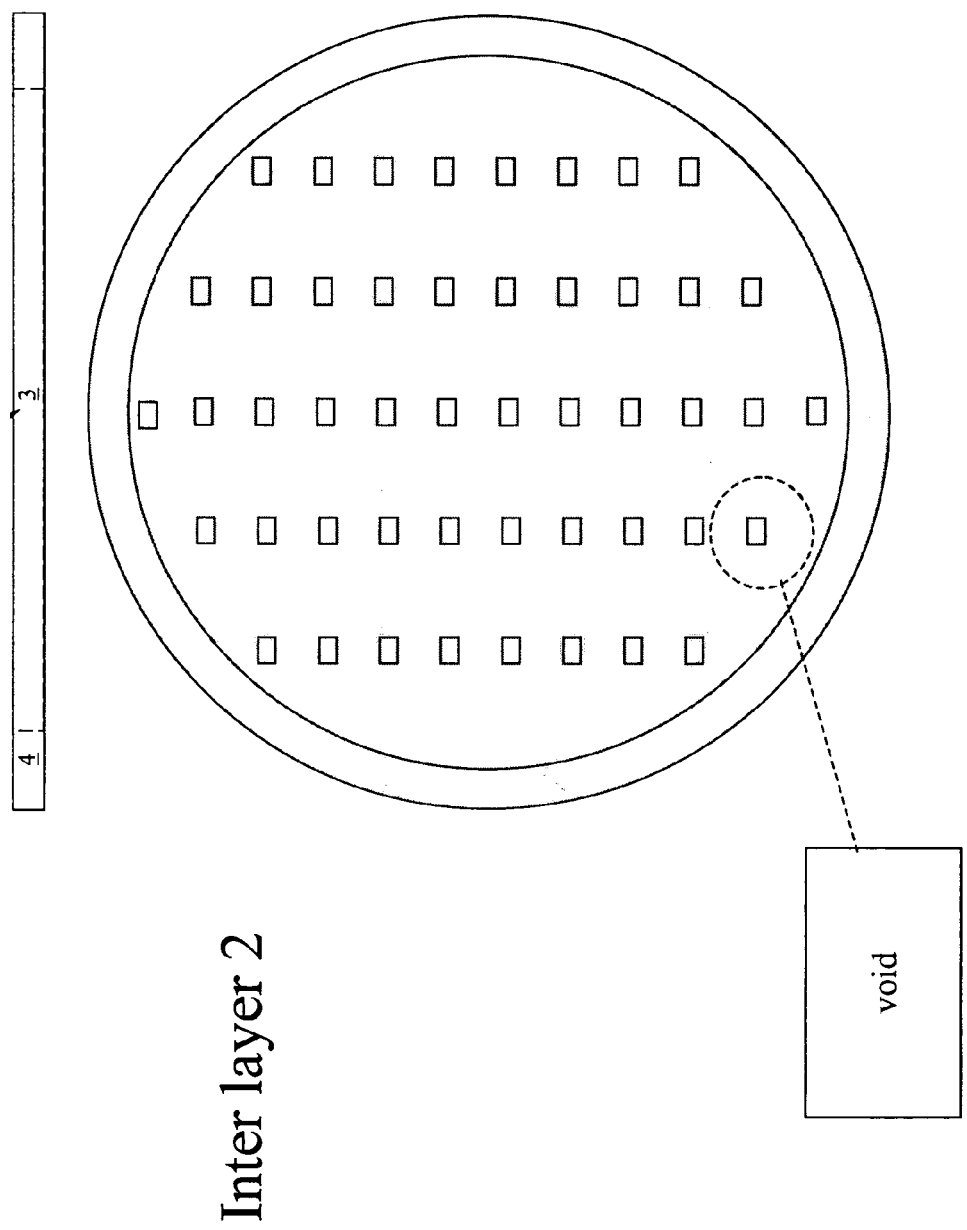
Figure 32:
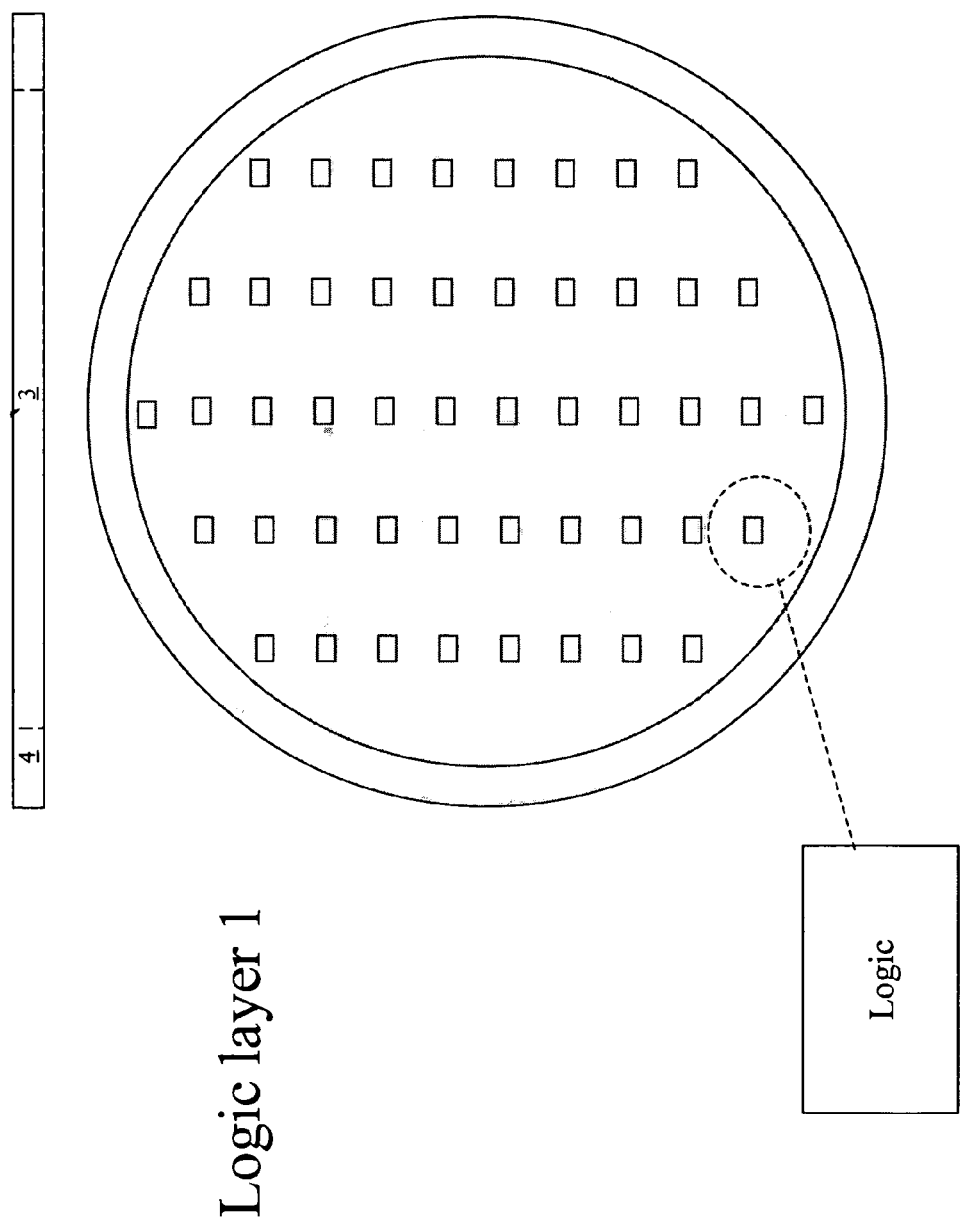
Figure 33:
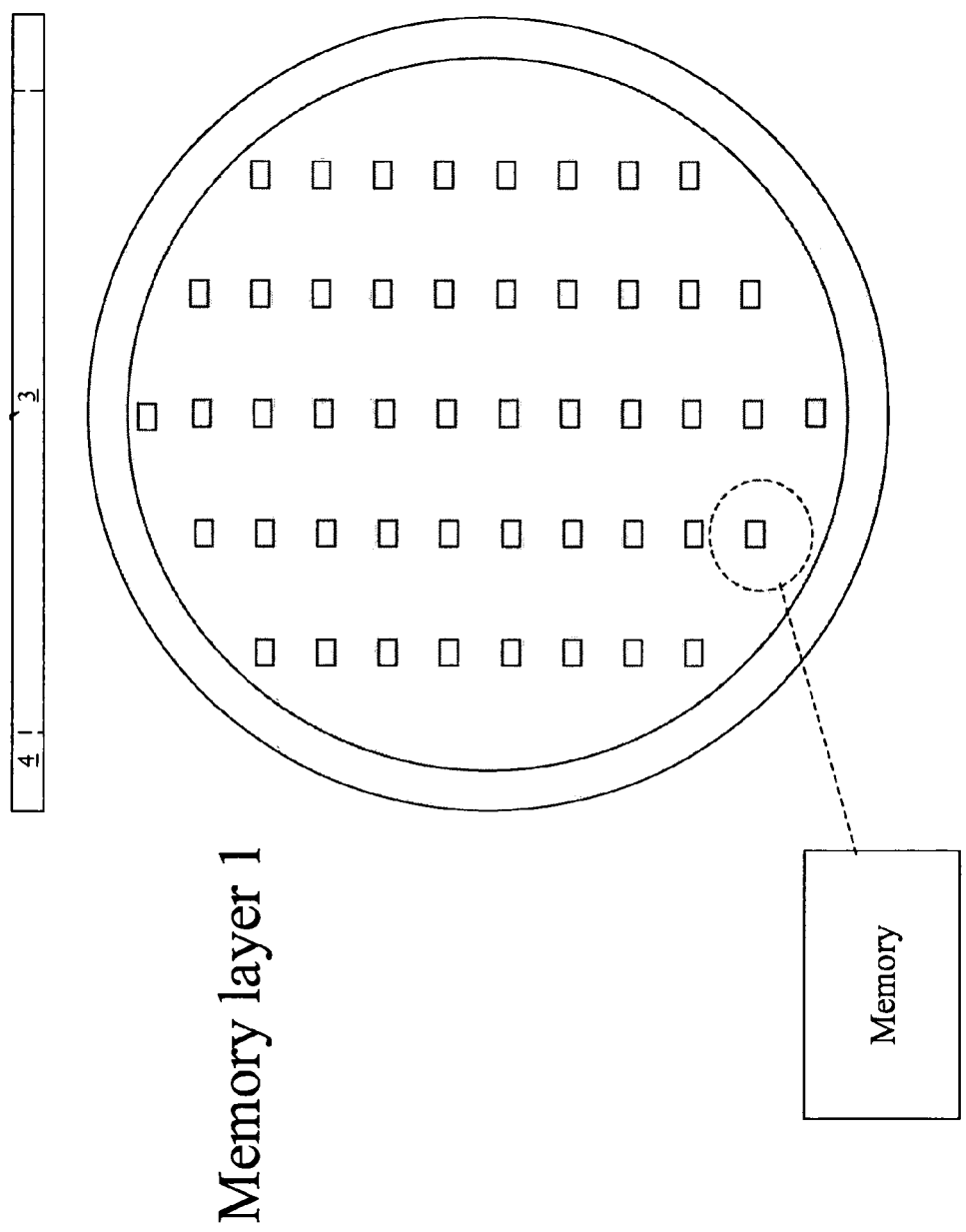

Referring now to FIGS. 29–34, processing steps for forming a vertically integrated MEMS based device is shown. FIG. 29 shows a side and top view of a peeled layer (e.g., corresponding to a layer 1 above) with plural voids (in the weak bond regions) intended to be registered with actuatable micromirrors, actuators, or other MEMS. Note that certain devices may not require void regions to allow for movement, and further such void regions may be incorporated in the layer containing the MEMS themselves. FIG. 30 shows a side and top view of a peeled layer (e.g., corresponding to a layer 1 above), for example, with plural actuatable micromirrors, actuators, or other MEMS processed thereon (in the weak bond regions) as known in the art. FIG. 31 shows a side and top view of another optional peeled layer (e.g., corresponding to a layer 1 above) with plural voids (in the weak bond regions) intended to be registered with actuatable micromirrors, actuators, or other MEMS. FIG. 32 shows a side and top view of a peeled layer (e.g., corresponding to a layer 1 above), for example, with plural logic devices (in the weak bond regions) intended to be operably coupled with associated MEMS devices shown in FIG. 30. FIG. 33 shows a side and top view of a peeled layer (e.g., corresponding to a layer 1 above), for example, with plural memory devices (in the weak bond regions) intended to be operably coupled with associated MEMS devices and logic devices shown in FIGS. 30 and 32, respectively.

Figure 34:
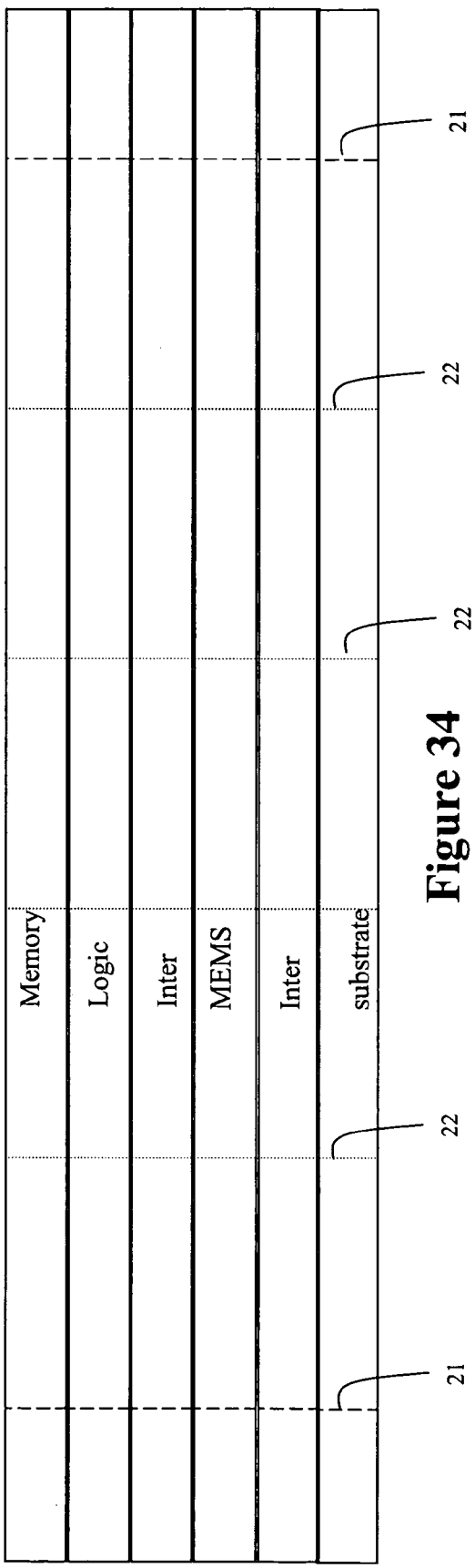
Figure 35:
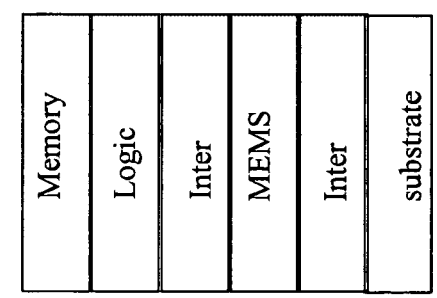
FIG. 35 shows an exemplary vertically integrated MEMS.

Each of the separate device (or void) layers in FIGS. 29–33 are then stacked as shown in FIG. 34 to form a plurality of vertically integrated MEMS device including associated logic and memory (and other functionality as needed as will be apparent to one skilled in the art). The edges of the layers (corresponding to the strong bond regions and indicated at dashed lines 21) may be removed, and the individual vertically integrated MEMS devices including associated logic and memory may be die cut at dashed lines 22.

Device integration must address the issue of compounded yield loss. Consider a stack in which the number of layers equals n. If each device in a stack is manufactured with a yield of Y %, the yield for the integrated system is Y raised to the nth power. As the number of layers increases, the system yield becomes very small, very quickly. For a 5-layer stack made up of devices which have a 90% yield, about 40% of the stacks will contain a non-functional die. While the example considers yield loss in stacking integration, the situation is similar when integrating different types of process flows onto a single chip area.

A MEMS integration scheme preferably allows for compounded yield loss by using KGD, by building in redundant capabilities which allow full functionality of the suite even if a particular device is non-functional, or by having a cost structure which can support low yield. As mentioned before, using known-good-die is an expensive option limited to high reliability and high cost applications. Designing redundant devices comes with a penalty in chip area, power consumption, operating complexity and pin count. Vertical stacking mitigates the area penalty by stacking the devices. By taking advantage of the vertical dimension, the devices can layered without increased package size and cost.

The advantages of MEMS and processes for forming MEMS described herein include: economy, ability to use best-of-class sensors (no tradeoffs in device process flow), open architecture, and they are extendible to hybrid MEMS-microelectronics suites.

A vertical integration process flow is provided that makes possible an open architecture MEMS sensor suite. Specifically, a sensor suite with combining temperature, relative humidity and 3-axis shock measurement is to be designed, but the method is expected to apply generically to integration of all sensor types, and to MEMS plus electronic controller chip combinations.

A 3-D integrated sensor suite is also provided using the methods described herein. In one embodiment, a commodity sensor may be selected for a foundation (handle) wafer.

A whole wafer may be processed, including desired die sizes and I/O layouts. Remaining sensors may be designed to physical dimensions of and bond pads of commercial die.

A starting wafer is also provided for peeling after device fabrication, wherein the starting wafer includes a portion of a 3-D MEMS such as a sensor suite. Further, a process to manufacture such starting wafers, facilitating wafer-scale device removal and transfer, is provided.

The 3-D MEMS may have throughhole connects or edge connects, as are known to those skilled in the art.

The methods and structures herein may be expanded beyond MEMS and hybrid MEMS suites to high density microelectronics stacks. Examples of the former are extremely high density memory stacks (petabyte) and combinations of memory and logic chips.

The method will enable rapid prototyping and production of any type of sensor suite. The method is extendable to ultra-high density electronics packaging and to high density combinations of MEMS with ASIC controllers and memory chips.

The MEMS have an open architecture which allows any of the individual components to be changed, at any time, with minimal redesign and mask changes.

Applications for MEMS sensors have been discussed above. As discussed, MEMS sensors are forecast to have very high compound annual growth rate of 35%. The improved cost structure that vertical integration will open many new applications to MEMS technology.

While preferred embodiments have been shown and described, various modifications and substitutions may be made thereto without departing from the spirit and scope of the invention. Accordingly, it is to be understood that the present invention has been described by way of illustrations and not limitation.

What is claimed is:

1. A MEMS layer, wherein the MEMS layer prior to fabrication of the MEMS on the layer is selectively bonded to a substrate layer, wherein selective bonding includes at least one region of strong bonding and at least one region of weak bonding at the interface of the MEMS layer and the substrate layer, wherein a plurality of MEMS are formed upon or within the surface of the MEMS layer at the region of weak bonding, and further wherein the MEMS layer is removable from the substrate by debonding primarily at the strong bond region.

2. The MEMS layer as in claim 1, wherein the MEMS layer is selectively bonded to the substrate layer at a periphery of an interface between the MEMS layer and the substrate layer.

3. A vertically integrated MEMS system, comprising a MEMS layer as in claim 1 and an associated control layer.

4. The vertically integrated MEMS system as in claim 3, wherein the associated control layer is selected from the group of control components consisting of logic, memory, thermal control, a similar MEMS as formed upon or within the MEMS layer, a different MEMS as formed upon or within the MEMS layer, or any combination comprising at least one of the foregoing control components.

5. A method of making a MEMS layer comprising:
   providing a layered structure of including a first layer selectively bonded to a second layer, the selective bonding including one or more regions of weak bonding and one or more regions of strong bonding; and
   processing at least a portion of a MEMS in or upon the first layer at the region of weak bonding.

6. The method as in claim 5, further comprising debonding the first layer from the second layer, wherein debonding minimally damages the MEMS.

7. A method of making a MEMS device comprising:
   providing a first layer and a second layer;
   treating regions of the first layer, the second layer, or both the first layer and the second layer for weak bonding;

bonding the first and second layers; and forming one or more MEMS on the first layer at the regions of weak bonding.

8. A method of making a MEMS device comprising:

selectively adhering a first layer to a second layer; and forming one or more MEMS on the first layer at the regions of weak bonding.

9. The method as in claim 8, wherein the selective adhering comprises providing strong bond regions at an interface between the first layer and the second layer treated with an adhesive material or processing step, and further wherein weak bond regions remain at the interface between the first layer and the second layer that are not treated with an adhesive material or processing step.

10. The method as in claim 8, wherein the selective adhering comprises providing strong bond regions at an interface between the first layer and the second layer treated with an adhesive material or processing step, and further wherein weak bond regions remain at the interface between the first layer and the second layer that are treated for a lesser degree of adhesion as compared to the strong bond regions.

11. The method as in claim 8, wherein the selective adhering comprises providing weak bond regions at an interface between the first layer and the second layer having greater porosity than strong bond regions at the interface between the first layer and the second layer.

12. The method as in claim 8, wherein the selective adhering comprises providing weak bond regions at an interface between the first layer and the second layer having a plurality of pillars.

13. The method as in claim 8, wherein the selective adhering comprises providing weak bond regions at an interface between the first layer and the second layer having a porous carbon material.

14. The method as in claim 8, wherein the selective adhering comprises providing strong bond regions at an interface between the first layer and the second layer that are irradiated to promote adhesion.

15. The method as in claim 8, wherein the selective adhering comprises providing weak bond regions at an interface between the first layer and the second layer having a porous solid material derived from a slurry comprising the solid material and a decomposable component.

16. The method as in claim 8, wherein the selective adhering comprises providing weak bond regions at an interface between the first layer and the second layer having a void.

17. The method as in claim 8, wherein the selective adhering comprises providing weak bond regions at an interface between the first layer and the second layer having metal, wherein the first layer and the second layer comprise a material selected from the group consisting of semiconductor, insulator, and a combination of semiconductor and insulator.

18. The method as in claim 8, wherein the selective adhering comprises providing strong bond regions at an interface between the first layer and the second layer having hydrophilic characteristics.

19. The method as in claim 8, wherein the selective adhering comprises providing strong bond regions at an interface between the first layer and the second layer having an adhesive, wherein the interface may be delaminated by light.

20. The method as in claim 8, wherein the selective adhering comprises providing weak bond regions at an interface between the first layer and the second layer having ions or particles implanted at the interface of the first layer and the second layer.

21. The method as in claim 8, wherein the selective adhering includes a bonding technique selected from the group consisting of eutectic, fusion, anodic, vacuum, Van der Waals, chemical adhesion, hydrophobic phenomenon, hydrophilic phenomenon, hydrogen bonding, coulombic forces, capillary forces, very short-ranged forces, or a combination comprising at least one of the foregoing bonding techniques.

22. The method as in claim 8, wherein the selective adhering comprises providing strong bond regions at the periphery of an interface between the first layer and the second.

23. The method as in claim 22, further comprising debonding the first layer from the second layer by selectively scanning the strong bond regions.

* * * * *